(12) United States Patent
Orr et al.

(10) Patent No.: US 9,780,234 B2
(45) Date of Patent: Oct. 3, 2017

(54) PHOTOVOLTAIC BYPASS AND OUTPUT SWITCHING

(71) Applicant: Solantro Semiconductor Corp., Ottawa (CA)

(72) Inventors: Raymond Kenneth Orr, Kanata (CA); Antoine Marc Joseph Richard Paquin, Navan (CA)

(73) Assignee: SOLANTRO SEMICONDUCTOR CORP., Ottawa, Ontario (CA)

( * ) Notice: Subject to any disclaimer, the term of this patent is extended or adjusted under 35 U.S.C. 154(b) by 615 days.

(21) Appl. No.: 14/286,076

(22) Filed: May 23, 2014

(65) Prior Publication Data

US 2014/0368058 A1 Dec. 18, 2014

Related U.S. Application Data

(60) Provisional application No. 61/834,969, filed on Jun. 14, 2013.

(51) Int. Cl.
| | |
|---|---|
| *H01H 19/14* | (2006.01) |
| *H01L 31/02* | (2006.01) |
| *H02J 3/38* | (2006.01) |

(52) U.S. Cl.
CPC ........ *H01L 31/02021* (2013.01); *H02J 3/383* (2013.01); *Y02E 10/563* (2013.01); *Y10T 307/76* (2015.04)

(58) Field of Classification Search
CPC .......... H02J 1/12; H02J 3/383; H02M 3/1584; H02M 2001/007; Y10T 307/707; Y10T 307/696; Y02E 10/563

(Continued)

(56) References Cited

U.S. PATENT DOCUMENTS

| | | |
|---|---|---|
| 6,271,651 B1 | 8/2001 | Stratakos et al. |
| 7,962,249 B1 | 6/2011 | Zhang et al. |

(Continued)

FOREIGN PATENT DOCUMENTS

| | | |
|---|---|---|
| CN | 201327835 Y | 10/2009 |
| CN | 201623499 U | 11/2010 |

(Continued)

OTHER PUBLICATIONS

Extended European Search Report dated Mar. 25, 2015 in respect of European Patent Office Application No. 14159173.5 (5 pages).

(Continued)

*Primary Examiner* — Rexford Barnie
*Assistant Examiner* — Toan Vu
(74) *Attorney, Agent, or Firm* — Barnes & Thornburg LLP

(57) ABSTRACT

A PhotoVoltaic (PV) panel switching arrangement includes a first switch and a second switch, which in some embodiments are in a DC converter. The first switch is to be coupled between a power system and a first end of a circuit path of the PV panel, and the second switch is to be coupled between (i) a point between the first switch and the power system and (ii) a point between a second end of the circuit path and the power system. The switches are controlled for DC conversion of PV panel output where the circuit path of the PV panel is not to be bypassed, and to disconnect the first end of the circuit path from the power system and to close a bypass circuit path that bypasses the circuit path on a determination that the circuit path of the PV panel is to be bypassed.

26 Claims, 19 Drawing Sheets

(58) Field of Classification Search
USPC .......................................................... 307/115
See application file for complete search history.

(56) References Cited

U.S. PATENT DOCUMENTS

| | | | |
|---|---|---|---|
| 8,837,098 | B2 | 9/2014 | Victor |
| 2001/0023703 | A1 | 9/2001 | Kondo et al. |
| 2007/0186969 | A1* | 8/2007 | Kohler ............... H01L 31/02008 136/244 |
| 2008/0164766 | A1 | 7/2008 | Adest et al. |
| 2009/0207543 | A1 | 8/2009 | Boniface et al. |
| 2010/0002349 | A1 | 1/2010 | La Scala et al. |
| 2010/0071742 | A1 | 3/2010 | de Rooij et al. |
| 2010/0288327 | A1 | 11/2010 | Lisi et al. |
| 2011/0278955 | A1 | 11/2011 | Signorelli et al. |
| 2012/0025617 | A1 | 2/2012 | Mateicka |
| 2012/0049879 | A1 | 3/2012 | Crites |
| 2012/0161527 | A1 | 6/2012 | Casey |
| 2012/0163048 | A1 | 6/2012 | Victor |
| 2012/0173031 | A1 | 7/2012 | Parameswaran et al. |
| 2012/0194003 | A1* | 8/2012 | Schmidt ............ H01L 31/02021 307/116 |
| 2012/0235687 | A1 | 9/2012 | Abe et al. |
| 2012/0306289 | A1 | 12/2012 | Pozsgay |
| 2012/0313455 | A1 | 12/2012 | Latham |
| 2013/0009483 | A1 | 1/2013 | Kawate et al. |
| 2013/0026842 | A1* | 1/2013 | Arditi ..................... H02J 1/10 307/82 |
| 2013/0038129 | A1 | 2/2013 | Bundschuh et al. |
| 2013/0057989 | A1 | 3/2013 | Victor |
| 2013/0241297 | A1 | 9/2013 | Falk et al. |
| 2014/0001865 | A1 | 1/2014 | Osterloh et al. |
| 2014/0226379 | A1* | 8/2014 | Harrison ............. H02M 7/5395 363/71 |
| 2014/0373894 | A1 | 12/2014 | Stratakos et al. |

FOREIGN PATENT DOCUMENTS

| | | |
|---|---|---|
| DE | 102011110682 A1 | 2/2013 |
| IT | WO2011128875 A1 | 10/2011 |
| JP | WO2013018794 A1 | 2/2013 |
| WO | 2009051870 A1 | 4/2009 |
| WO | 2010078303 | 7/2010 |
| WO | 2012079742 | 6/2012 |

OTHER PUBLICATIONS

U.S. Office Action dated Nov. 19, 2015 in respect of U.S. Appl. No. 13/840,162 (37 pages).
U.S. Final Office Action dated Dec. 22, 2015 in respect of U.S. Appl. No. 13/840,627 (15 pages).
Office Action dated Oct. 8, 2016 in respect of U.S. Appl. No. 13/840,627 (13 pages).
Office Action dated Aug. 14, 2015 in respect of U.S. Appl. No. 13/840,627 (9 pages).
Shamsiah Ali-Oettinger, Solar Fire and Theft Protection, Photovoltaic News and PV Jobs, Industry & Suppliers, Markets & Trends, Research & Development, Mar. 14, 2013, two pages.
Extended European Search Report dated Mar. 26, 2015 in respect of European Patent Office Application No. 14159176.8 (6 pages)
Chinese Office Action issued in Application No. 20140099109.5 dated Mar. 23, 2017, pp. 1 to 21.

* cited by examiner

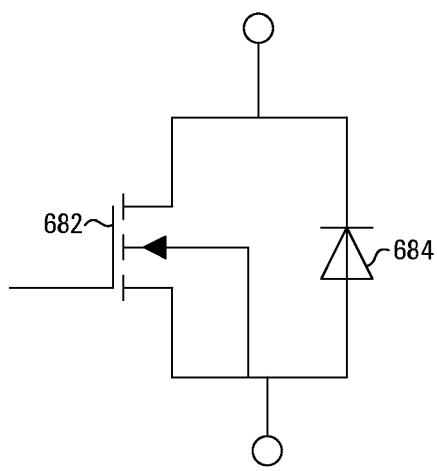 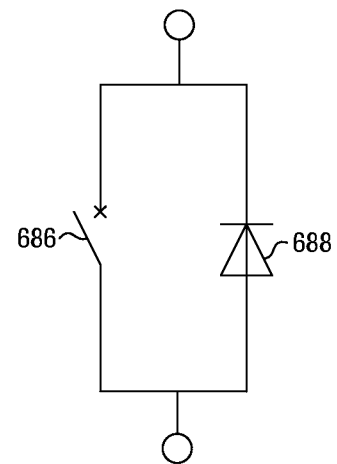
FIG. 6B  FIG. 6C

PHOTOVOLTAIC BYPASS AND OUTPUT SWITCHING

CROSS-REFERENCE TO RELATED APPLICATION

This application claims the benefit of U.S. Provisional Patent Application No. 61/834,969, filed Jun. 14, 2013, the entire contents of which are incorporated herein by reference.

FIELD OF THE INVENTION

This invention relates generally to PhotoVoltaic (PV) panels and in particular, to improving their tolerance to shading or reduced insolation.

BACKGROUND

PhotoVoltaic (PV) solar panels are an important source of power for the electrical grid. Large, megawatt PV installations with PV panels numbering in the tens of thousands are increasingly common. PV panel arrays are typically organized into panel "strings" with each string consisting of from 10 to 20 PV panels connected in series. In a Direct Current (DC) PV panel system, the output of a PV panel string could connect to a central inverter which converts the DC power of the PV panels into AC power suitable for the electrical grid. Typical PV panel string voltages at the inverter input may range from 500 V to 1000V.

A typical PV panel is organized as a series connection of individual PV cells. A common configuration is 72 PV cells per panel. A typical PV cell operating voltage under illumination is about 0.7 V. An illuminated 72 PV cell panel will therefore have an output voltage of about 50 volts DC.

A known problem of connecting PV panels and PV cells in series is uneven photocurrents produced by individual PV cells. Uneven photocurrents may be caused by one or more of: shading of a particular PV cell or group of PV cells in a PV panel, shading of an entire PV panel in a multi-panel system, soiling of a portion of a PV panel or an entire PV panel in a multi-panel system, differences in PV panel orientation relative to the illumination source, and PV cell/panel manufacturing variations. Since all PV cells in a PV panel are series connected, the current output of the PV panel is limited by the PV cell with the lowest photocurrent. In the case of a heavily shaded PV cell, a large reverse bias voltage may be generated across it by the remaining unshaded PV cells, forcing current through the shaded PV cell. This reverse bias voltage may become large enough to cause a catastrophic breakdown of the PV cell and create permanent damage.

A common solution to this problem is to add anti-parallel bypass diodes in parallel with groups of PV cells. A common arrangement for a 72 PV cell panel is to have three "sub-strings" of 24 PV cells each, with one bypass diode per sub-string. Bypass diodes prevent formation of high reverse bias voltages. The bypass diode is normally reverse biased. However, when a portion of the PV cells in a sub-string become sufficiently shaded, for example, the bypass diode will become forward biased and conduct the photocurrent of the remaining unshaded sub-strings, preventing damage to the PV cells in the shaded or partially shaded sub-string.

Bypass diodes have a number of disadvantages. For instance, they are prone to failure. If the failure is an open circuit failure, then the bypass diode's PV cell sub-string is no longer protected and the PV panel may suffer catastrophic failure. If the bypass diode failure is a short circuit failure, then the PV cell sub-string to which the failed diode is attached will not produce useful power. Another disadvantage of bypass diodes is their power dissipation. Bypass diodes decrease PV panel efficiency by consuming power whenever they become forward biased. A bypass diode has a forward bias voltage of about 0.7 V. With a typical PV panel current of 8 A, each forward biased bypass diode dissipates 5.6 W. If a PV panel that includes three PV cell sub-strings and three bypass diodes were heavily shaded and its three bypass diodes were to become forward biased, then the fully bypassed PV panel would actually represent a load, dissipating 16.8 W. With one and two PV cell sub-strings bypassed, the forward biased bypass diode(s) would reduce the power output of this example PV panel by 5.6 W and 11.2 W respectively.

SUMMARY

A PV panel bypass switching arrangement includes a DC converter to be coupled between a power system and a circuit path of the PV panel in which a plurality of PV cells of the PV panel are connected. The DC converter includes a first switch to be coupled between a power system and a first end of a circuit path of the PV panel, and a second switch to be coupled between (i) a point between the first switch and the power system and (ii) a point between a second end of the circuit path of the PV panel and the power system. The PV panel switching arrangement also includes a controller operatively coupled to the first switch and to the second switch, to determine whether the circuit path of the PV panel is to be bypassed, to control the first and second switches for DC conversion of PV panel output on a determination that the circuit path of the PV panel is not to be bypassed, and to control the first switch to disconnect the first end of the circuit path of the PV panel from the power system and the second switch to close a bypass circuit path that bypasses the circuit path of the PV panel on a determination that the circuit path of the PV panel is to be bypassed.

In an embodiment, a switching arrangement also includes a voltage sensor, to be coupled to measure a voltage difference across PV cells in the circuit path of the PV panel, and the controller is coupled to the voltage sensor to determine whether the circuit path of the PV panel is to be bypassed based on the voltage difference measured by the voltage sensor.

A switching arrangement could include a voltage sensor, to be switchably coupled between respective pairs of voltage measuring points in the circuit path of the PV panel between which respective sub-strings of the plurality of PV cells are connected, to measure respective voltage differences between the respective voltage measuring points. The controller could then be coupled to the voltage sensor to determine whether the circuit path of the PV panel is to be bypassed based on the voltage differences measured by the voltage sensor.

A switching arrangement might also include respective PV cell sub-string switches to be coupled across respective PV cell sub-strings of the plurality of PV cells. The controller could then be operatively coupled to the PV cell sub-string switches, to determine whether each respective PV cell sub-string in the circuit path of the PV panel is to be bypassed, and to control the PV cell sub-string switches based on the determination of whether each PV cell sub-string in the circuit path of the PV panel is to be bypassed.

In an embodiment, a switching arrangement includes a power connection between the controller and the PV panel, to provide power to the controller from the PV panel, and the power connection includes a voltage stabilization circuit. The voltage stabilization circuit could include a diode, an anode of the diode being coupled to the PV panel and a cathode of the diode being coupled to a power input of the controller; a capacitance to couple the cathode of the diode to the second end of the circuit path of the PV panel.

The controller could be configured to further determine, subsequent to determining that the circuit path of the PV panel is to be bypassed, whether the PV panel is to be reconnected to the power system, and to further control the first and second switches for DC conversion on a further determination that the PV panel is to be reconnected to the power system.

For instance, the controller could be configured to open the first switch and close the second switch responsive to determining that the circuit path of the PV panel is to be bypassed. The controller could then be further configured to subsequently close the first switch and open the second switch, to further determine whether the PV panel is to be reconnected to the power system based on a voltage difference measured by the voltage sensor while the first switch is closed and the second switch is open, and to control the first and second switches for DC conversion on a further determination that the PV panel is to be reconnected to the power system.

In another embodiment, the controller is further configured to subsequently determine whether the PV panel is to be reconnected to the power system based on a voltage difference across the second switch while the second switch is closed, and to control the first and second switches for DC conversion on a determination that the PV panel is to be reconnected to the power system.

For PV cell sub-strings, the controller could determine whether a PV cell sub-string in the circuit path of the PV panel is to be bypassed based on the voltage differences measured by the voltage sensor. The controller could also or instead be configured to, responsive to determining that a PV cell sub-string in the circuit path of the PV panel is to be bypassed, close the PV cell sub-string switch that is coupled across the PV cell sub-string. The controller could then be further configured to determine, subsequent to determining that the PV cell sub-string is to be bypassed, whether the PV cell sub-string is to be reconnected based on a voltage difference across the PV cell sub-string switch while the PV cell sub-string switch is closed, and to control the PV cell sub-string switch of the PV cell sub-string based on the determination of whether the PV cell sub-string is to be reconnected. The controller could instead be further configured to subsequently open the PV cell sub-string switch, to further determine whether the PV cell sub-string is to be reconnected based on the voltage difference measured across the PV cell sub-string by the voltage sensor while PV cell sub-string switch is open, and to control the PV cell sub-string switch of the PV cell sub-string based on the determination of whether the PV cell sub-string is to be reconnected.

A PV panel system could include such a switching arrangement and a PV panel including the plurality of PV cells connected in the circuit path.

A power system could include a plurality of such PV panel systems.

The DC converter could be a buck converter, for example.

The controller could be configured to control the first and second switches for DC conversion in order to maintain the PV panel at its maximum power point, illustratively by controlling a duty cycle of switching the first switch for DC conversion.

The DC converter could also include: an inductance coupled between the first switch and a first terminal through which the DC converter is to be coupled to the power system; a capacitance coupled between the first terminal and a second terminal through which the DC converter is to be coupled to the power system.

A method includes determining whether a circuit path of a PhotoVoltaic (PV) panel, in which a plurality of PV cells of the PV panel are connected, is to be bypassed; controlling first and second switches of a DC converter for DC conversion of PV panel output on determining that the circuit path of the PV panel is not to be bypassed, the first switch being coupled between a power system and a first end of the circuit path of the PV panel, the second switch being coupled between (i) a point between the first switch and the power system and (ii) a point between a second end of the circuit path of the PV panel and the power system; controlling the first switch to disconnect the first end of the circuit path of the PV panel from the power system on determining that the circuit path of the PV panel is to be bypassed; controlling the second switch to close a bypass circuit path that bypasses the circuit path of the PV panel on determining that the circuit path of the PV panel is to be bypassed.

A method could also include measuring a voltage difference across PV cells in the circuit path of the PV panel, in which case the determining might include determining whether the circuit path of the PV panel is to be bypassed based on the measured voltage difference.

In an embodiment, a method also includes measuring respective voltage differences across respective sub-strings of the plurality of PV cells in the circuit path of the PV panel. The determining could then involve determining whether the circuit path of the PV panel is to be bypassed based on the measured voltage differences.

A method could include determining whether each respective PV cell sub-string in the circuit path of the PV panel is to be bypassed; controlling respective PV cell sub-string switches coupled across the respective PV cell sub-strings, based on the determination of whether each PV cell sub-string in the circuit path of the PV panel is to be bypassed.

Power could be provided to a controller from the PV panel, in which case a method could include stabilizing a voltage that is provided to power the controller.

The stabilizing could involve providing a stabilization circuit comprising: a diode, an anode of the diode being coupled to the PV panel and a cathode of the diode being coupled to a power input of the controller; and a capacitance to couple the cathode of the diode to the second end of the circuit path of the PV panel; opening the first switch and closing the second switch when the capacitance discharges to a first voltage; closing the first switch and opening the second switch when the capacitance charges to a second voltage above the first voltage.

A method could also include determining, subsequent to determining that the circuit path of the PV panel is to be bypassed, whether the PV panel is to be reconnected to the power system; further controlling the first and second switches for DC conversion on determining that the PV panel is to be reconnected to the power system.

Where the controlling of the first switch involves opening the first switch responsive to determining that the circuit path of the PV panel is to be bypassed and the controlling of the second switch involves closing the second switch responsive to determining that the circuit path of the PV panel is to be bypassed, the method could also include subsequently closing the first switch and opening the second switch; determining whether the PV panel is to be reconnected to the power system based on a voltage difference measured while the first switch is closed and the second switch is open; controlling the first and second switches for DC conversion on determining that the PV panel is to be reconnected to the power system.

In another embodiment of reconnection, the method involves subsequently determining whether the PV panel is to be reconnected to the power system based on a voltage difference across the second switch while the second switch is closed; controlling the first and second switches for DC conversion on determining that the PV panel is to be reconnected to the power system.

For PV cell sub-strings, determining whether a PV cell sub-string in the circuit path of the PV panel is to be bypassed could be based on measured voltage differences. The controlling of the respective PV cell sub-string switches could involve, responsive to determining that a PV cell sub-string in the circuit path of the PV panel is to be bypassed, closing the PV cell sub-string switch that is coupled across the PV cell sub-string. The method could then also involve subsequently determining whether the PV cell sub-string is to be reconnected based on a voltage difference across the PV cell sub-string switch while the PV cell sub-string switch is closed; controlling the PV cell sub-string switch of the PV cell sub-string based on the determination of whether the PV cell sub-string is to be reconnected. In another embodiment, the method includes subsequently opening the PV cell sub-string switch; determining whether the PV cell sub-string is to be reconnected to the power system based on the voltage difference measured across the PV cell sub-string while the PV cell sub-string switch is open; controlling the PV cell sub-string switch based on the determination of whether the PV cell sub-string is to be reconnected.

Another method includes providing a PV panel comprising a circuit path in which a plurality of PV cells are connected; providing a first switch to switchably connect a first end of the circuit path of the PV panel to a power system; providing a second switch to switchably connect (i) a point between the first switch and the power system and (ii) a point between a second end of the circuit path of the PV panel and the power system; providing a controller to determine whether the circuit path of the PV panel is to be bypassed and to control the first and second switches based on the determination.

According to a further embodiment, a method involves: providing a PV panel comprising a circuit path in which a plurality of PV cells are connected; providing a DC converter comprising a first switch to switchably connect a first end of the circuit path of the PV panel to a power system and a second switch to switchably connect (i) a point between the first switch and the power system and (ii) a point between a second end of the circuit path of the PV panel and the power system; providing a controller to determine whether the circuit path of the PV panel is to be bypassed, to control the first and second switches for DC conversion of PV panel output on a determination that the circuit path of the PV panel is not to be bypassed, and to control the first switch to disconnect the first end of the circuit path of the PV panel from the power system and the second switch to close a bypass circuit path that bypasses the circuit path of the PV panel on a determination that the circuit path of the PV panel is to be bypassed.

BRIEF DESCRIPTION OF THE DRAWINGS

FIGS. 6B and 6C are schematic diagrams of example controllable switches.

DETAILED DESCRIPTION

Figure 1:
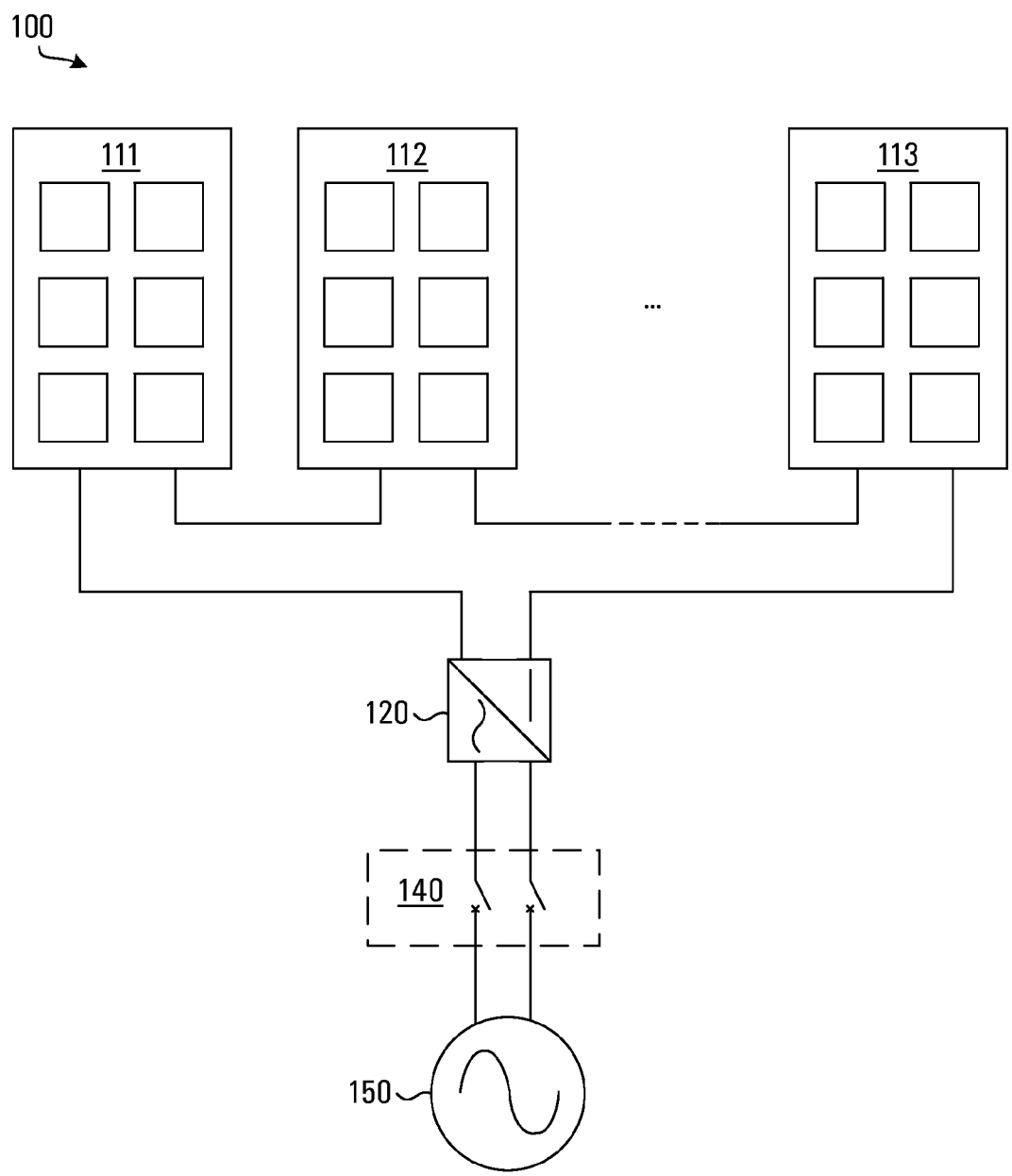
FIG. 1 is a block diagram of an example PV installation.

FIG. 1 is a block diagram of an example PV installation, tied to an electrical grid. The example installation 100 includes DC PV panels 111, 112, 113, which are series connected between DC inputs of a central inverter 120. The output of the inverter 120 connects to the electrical grid 150 through a disconnect switch 140.

Figure 2:
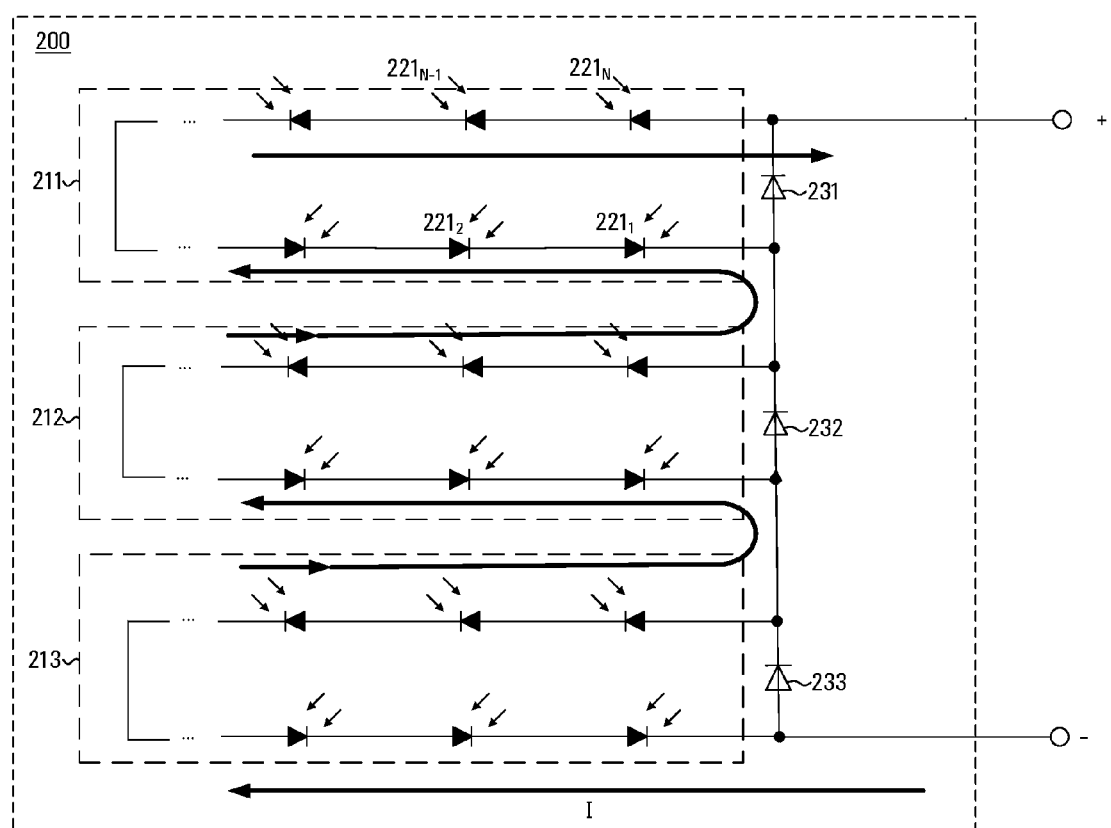
FIG. 2 is a schematic diagram of an example PV panel

FIG. 2 is a schematic diagram of an example PV panel. The example PV panel 200 includes PV cell sub-strings, 211, 212, 213. Each PV cell sub-string includes a series connection of N PV cells. In parallel with each PV cell sub-string is a bypass diode 231, 232, 233. Sub-string 211 includes photocells, also referred to herein as PV cells, $221_1$, $221_2$, ..., $221_{N-1}$, $221_N$ and is in parallel with (or across) bypass diode 231. The PV cell sub-strings 211, 212, 213 are in series with one another. Although this example PV panel 200 has three sub-strings 211, 212, 213, PV panels with fewer or larger numbers of sub-strings are possible.

In normal operation without shading, soiling or large manufacturing variations, all the bypass diodes 231, 232, 233 are reverse biased and current "I" flows through the PV cells as shown in FIG. 2.

Figure 3:
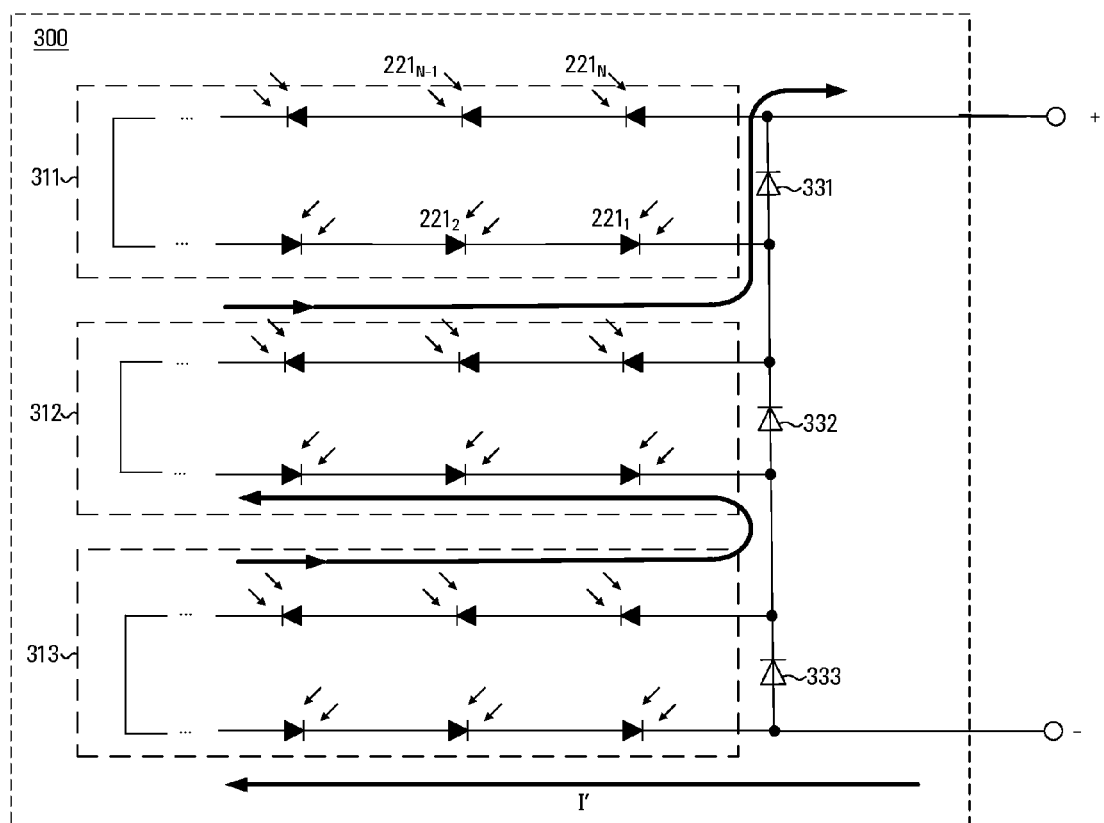
FIG. 3 is a schematic diagram showing current flow in an example PV panel with one bypassed PV cell sub-string.

FIG. 3 is a schematic diagram showing current flow in an example PV panel with one bypassed sub-string 311 (due to shading, for example). The example PV panel 300 has the same structure as the example PV panel 200 in FIG. 2, with three sub-strings 311, 312, 313 of PV cells and three bypass diodes 331, 332, 333. However, FIG. 3 illustrates a different current flow than FIG. 2.

In FIG. 3, the sub-string 311 has a lower photocurrent, due to shading for example, and the bypass diode 331 is forward biased. The PV panel photocurrent I' passes through the sub-strings 312 and 313 and the bypass diode 331.

Figure 4A:
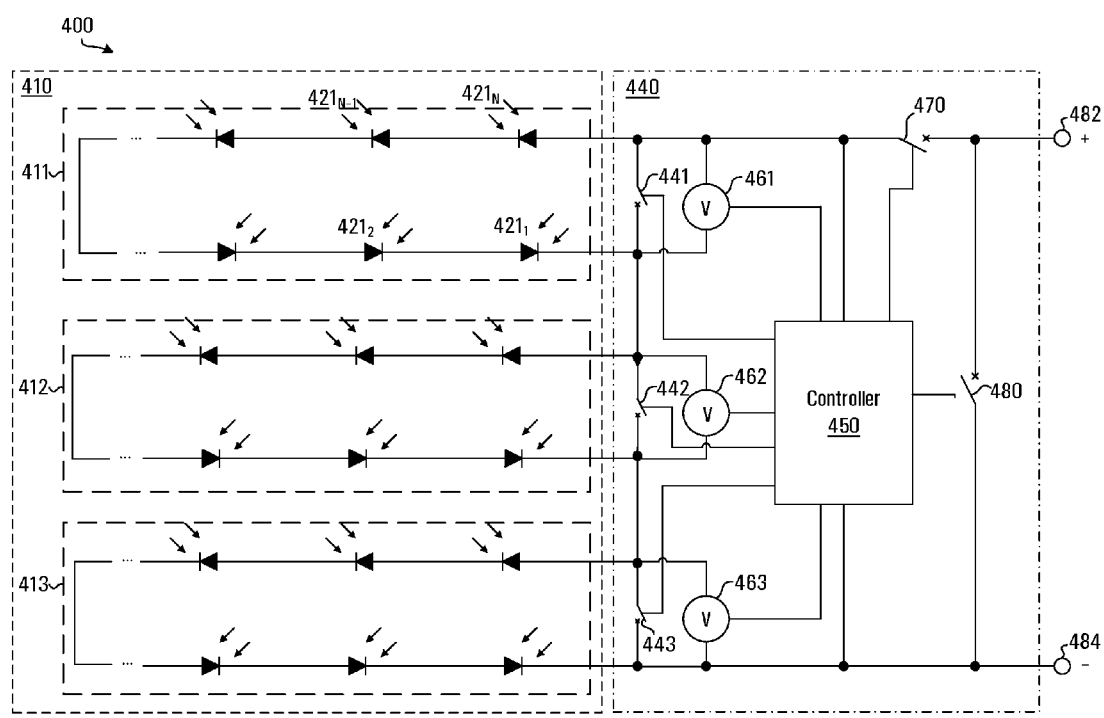
FIG. 4A is a schematic diagram of an example PV panel system.

As noted above, bypass diodes have disadvantages. FIG. 4A is a schematic diagram of an example PV panel system 400, which includes a PV panel 410 and a bypass switching arrangement 440. The bypass switching arrangement 440 incorporates bypass diode functionality and is designed for the example PV panel 410, which has three PV cell sub-strings 411, 412, 413 in the example shown. Each sub-string 411, 412, 413 has N PV cells, labelled $421_1$, $421_2$, ..., $421_{N-1}$, $421_N$ for the sub-string 411. Other numbers of sub-strings are contemplated.

Sub-string bypass switches 441, 442, 443 are coupled across or between ends of (i.e., in parallel with) their respective sub-strings 411, 412, 413. Sub-string voltages $V_{SS,1}$, $V_{SS,2}$ and $V_{SS,3}$ are measured by respective voltage sensors 461, 462, 463, illustratively voltmeters, and the measured voltage values are received by a controller 450. The controller 450 controls the operation of sub-string bypass switches 441, 442, 443, as well as a PV panel bypass switch 480 and a PV panel series switch 470. The sub-string bypass switches 441, 442, 443, and the PV panel series and bypass switches 470, 480, may be implemented using any of a variety of means, including power Metal Oxide Semiconductor Field Effect Transistors (MOSFETS), Insulated Gate Bipolar Transistors (IGBTs), Thyristors, and/or relays, for example.

482, 484 in FIG. 4A represent terminals through which a circuit path of the PV panel 410, in which the PV cells are connected, may connect to a power system. Such a power system could include multiple PV panel systems such as the example PV panel system 400.

In normal operation, when all PV panels in a string are producing substantially the same current, the sub-string bypass switches 441, 442, 443 are open, the panel bypass switch 480 is open, and the panel series switch 470 is closed. String current flows through the PV cell sub-strings 411, 412, 413 and the panel series switch 470. The PV panel 410 is in series with other PV panels in the panel string and contributes to the string voltage and current.

The controller 450 monitors measured values of the sub-string voltages received from the voltage sensors 461, 462, 463. On detection of a low voltage on a sub-string due to, for example, shading, the controller 450 closes that sub-string's bypass switch 441, 442, 443. In FIG. 4A for example, if the voltage difference across the sub-string 411 is low, then the controller 450 closes the bypass switch 441, shunting current around the sub-string and preventing the creation of harmful reverse voltages. The on-resistance of a MOSFET switch, for example, can be in the single milliohm (mΩ) range. Thus, the power dissipation of a MOSFET switch as the bypass switch 441 could be significantly lower than the power dissipation of a conventional bypass diode. For example, with a string current of 8 A and a MOSFET switch on-resistance of 1 mΩ, the power dissipation of the switch is only 64 mW, compared with bypass diode power dissipation of 5.6 W noted above under the same 8 A string current condition.

In one embodiment, the controller 450 closes a sub-string bypass switch 441, 442, 443 when the sub-string voltage across its connected sub-string 411, 412, 413 decreases below a certain sub-string bypass threshold value ($V_{SUB\_BY}$). In one embodiment, the value of $V_{SUB\_BY}$ is zero volts. In another embodiment, the controller 450 closes a sub-string bypass switch 441, 442, 443 when the sub-string voltage remains below a threshold value for longer than a specified time interval.

Sub-String Unbypassing

After a sub-string 411, 412, 413 has been bypassed by closing its bypass switch 441, 442, 443, the controller 450 may periodically check to determine whether the sub-string should be unbypassed by reopening its bypass switch. For example, the illumination of a bypassed sub-string may have changed sufficiently for it to be unbypassed, which the controller 450 could determine from one or more of the voltages measured by the voltage sensors 461, 462, 463. In one embodiment of sub-string unbypassing, the controller 450 periodically opens the previously closed sub-string bypass switch 441, 442, 443, and receives a measured sub-string voltage from a voltage sensor 461, 462, 463. In one embodiment, if the measured voltage has risen to above $V_{SUB\_BY}$ then the controller 450 keeps the sub-string bypass switch 441, 442, 443 open, and otherwise it recloses the bypass switch.

In another embodiment of sub-string unbypassing, the controller 450 determines the voltage across the closed sub-string bypass switch 441, 442, 443. If the voltage is greater than a threshold value, then the controller 450 unbypasses the sub-string by opening the sub-string bypass switch 441, 442, 443.

Figure 4B:
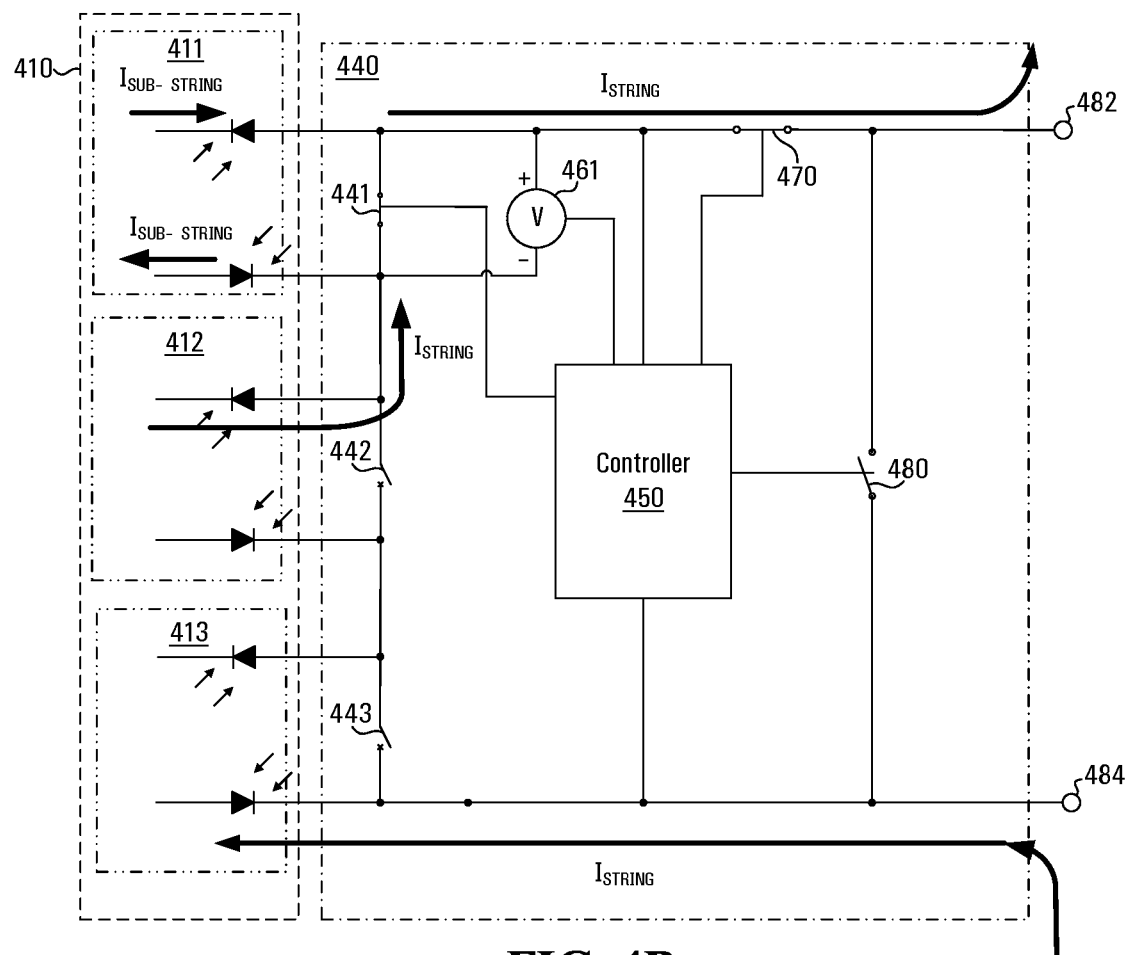
FIG. 4B is a schematic diagram showing the string current and sub-string currents flowing in an example PV panel system.

FIG. 4B is a schematic diagram showing the string current and sub-string currents flowing in an example PV panel system. PV panel 410 connects to a power system (not shown) through terminals 482, 484. PV panel bypass switch 480 is open and panel series switch 470 is closed, allowing string current $I_{STRING}$ to flow through the PV panel. Sub-string bypass switch 441 is closed, bypassing sub-string 411. The remaining sub-string bypass switches 442, 443 are open and their respective sub-strings 412, 413 are not bypassed. FIG. 4B relates to an example in which the sub-string 411 is bypassed, and therefore only the voltage sensor 461 is shown for the purposes of this particular example.

The current flowing in closed sub-string bypass switch 441 is the difference between the string current $I_{STRING}$ and the sub-string current $I_{SUB-STRING}$ of sub-string 411. The voltage across switch 441 is measured by voltage sensor 461. The polarity of the voltage measurement is indicated by the "+" and "−" signs on voltage sensor 461. When the voltage across sub-string bypass switch 441 is less than zero, this indicates that the string current is greater than the sub-string current. When the voltage across sub-string bypass switch 441 is zero, this indicates that the string current and the sub-string current are equal. When the voltage across sub-string bypass switch 441 is positive, this indicates that the sub-string current is larger than string current. With sub-string bypass switch 441 closed, the sub-string current of sub-string 411 is substantially equal to its short circuit current. The corresponding sub-string voltage at the short circuit current is zero. Thus, in one embodiment, the controller 450 opens sub-string bypass switch 441 and unbypasses the PV sub-string 411 when the voltage across sub-string bypass switch 441 is greater than zero. Under these conditions, the sub-string voltage across the unbypassed PV sub-string 411 will be greater than zero and the sub-string will contribute power to the power system.

Full PV Panel Bypass

The above sub-string bypass operation is suitable for bypassing up to two of the three sub-strings 411, 412, 413 in the example PV panel 410. Bypassing all of the sub-strings in a PV panel using sub-string bypass switches could be an issue where the controller 450 receives power for its operation from the PV panel 410. In the event that a low voltage were detected across all three sub-strings 411, 412, 413 in the example PV panel 410 and the bypass switches 441, 442, 443 were all to be closed, the output voltage of panel 410 might not be sufficient to power controller 450 and controller 450 might not be unable to provide sufficient drive voltages to operate any of the switches 441, 442, 443, 470, 480.

In one embodiment, if the sum of the sub-string voltages as measured by the voltage sensors 461, 462, 463 is below a threshold value ($V_{P\_BY}$), then the controller 450 closes the panel bypass switch 480 and opens the panel series switch 470 and the sub-string bypass switches 441, 442, 443 to completely bypass PV panel 410. In one embodiment, $V_{P\_BY}$ corresponds to a minimum operating voltage of the controller 450.

Figure 4C:
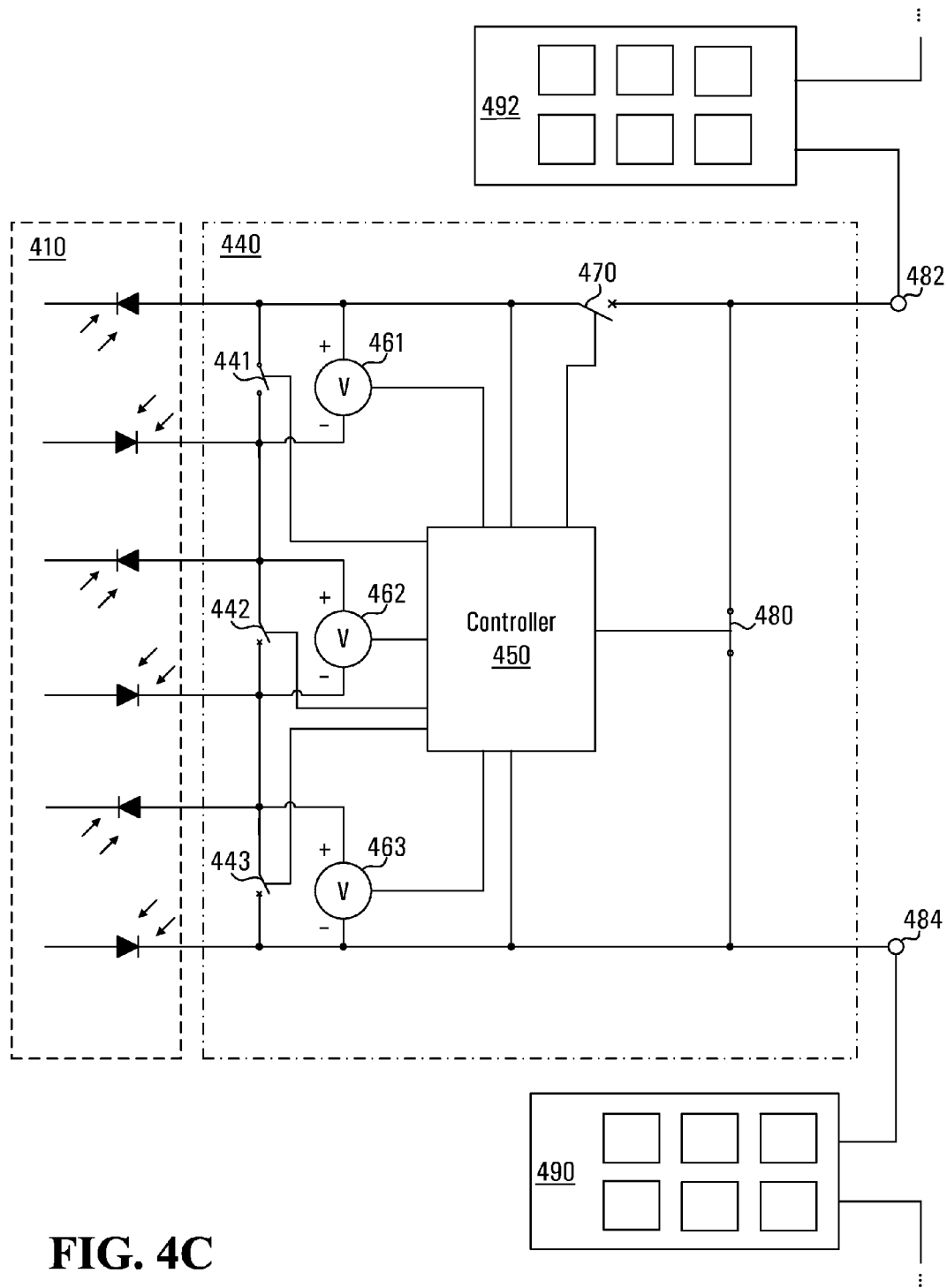
FIG. 4C is a schematic diagram showing bypassing of a PV panel in an example power system.

FIG. 4C is a schematic diagram showing complete bypassing of a PV panel in an example power system. In this embodiment, the example PV panel 410 is isolated from the terminals 482, 484 and thus from other PV panels 490, 492 in a power system PV panel string by the open panel series switch 470. The string current produced by the PV panels 490, 492 runs through closed panel bypass switch 480 and not through the PV panel 410. Sub-string bypass switches 441, 442, 443 are all open. The voltage across the PV panel 410 circuit path in which the PV cells are connected can rise sufficiently to power the controller 450 for its operation even when the PV panel is weakly illuminated.

In this type of bypass switching architecture and control, the string current only flows through one bypass switch (switch 480 in FIG. 4C) rather than a series connection of sub-string bypass switches 441, 442. 443. This can reduce power dissipation.

PV Panel Unbypassing

After a PV panel has been completely bypassed, the controller 450 could periodically check to determine whether the PV panel should be unbypassed, as a result of a change in illumination for instance. In one embodiment of this type of "wake-up" operation, the controller 450 periodically opens the panel bypass switch 480, closes the panel series switch 470, and receives measurements of the sub-string voltages from the voltage sensors 461, 462, 463 to determine whether the PV panel 410 should still be bypassed.

If the sum of the sub-string voltages is below the PV panel bypass threshold value ($V_{P\_BY}$), then the controller 450 recloses panel bypass switch 480 and reopens panel series switch 470. If the sum of the sub-string voltages is above the bypass threshold value ($V_{P\_BY}$), then the panel bypass switch 480 remains open and the panel series switch 470 remains closed. The controller 450 then determines which, if any, of the sub-strings 411, 412, 413 should be bypassed by the sub-string bypass switches 441, 442, 443.

Figure 4D:
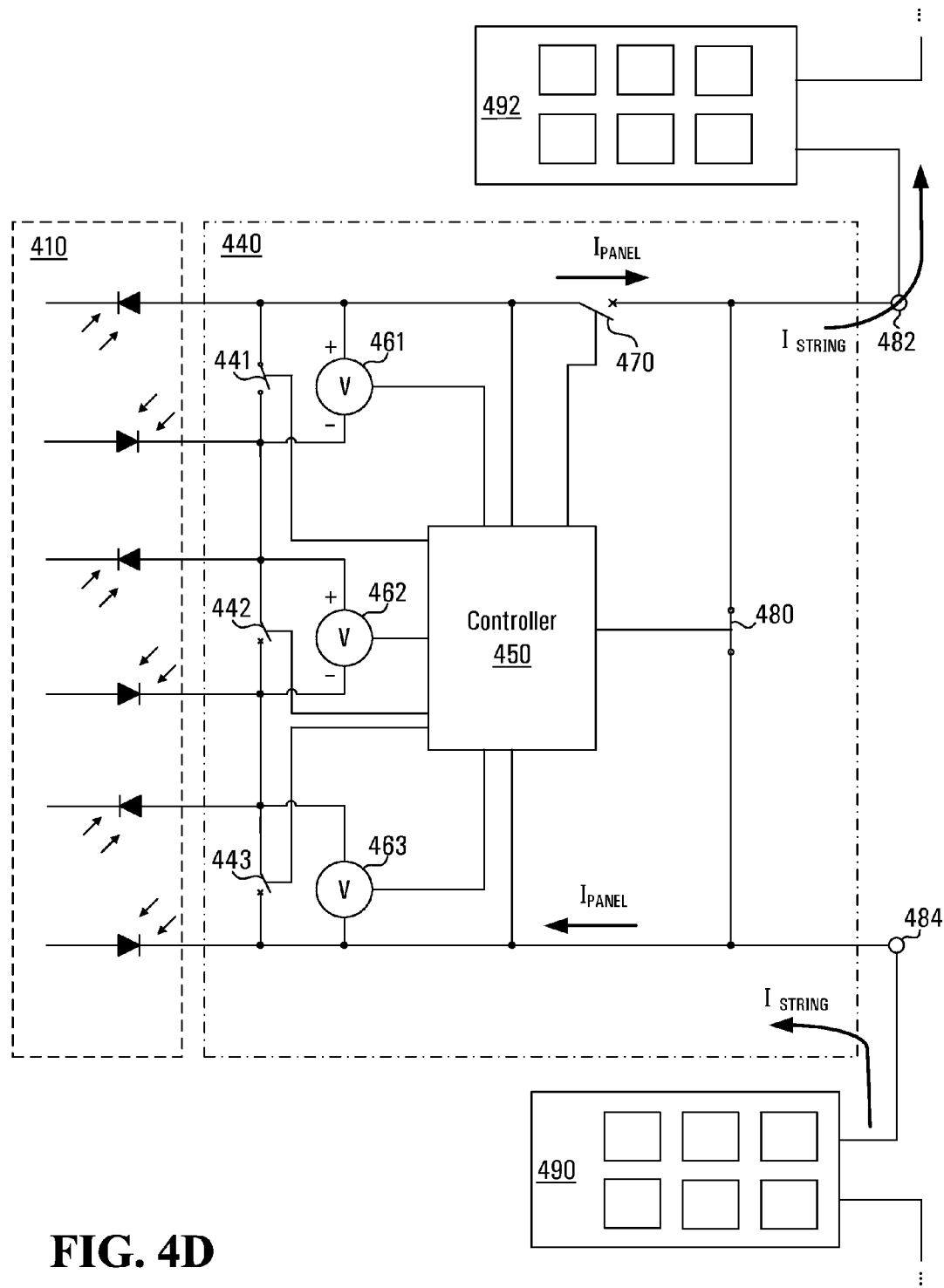
FIG. 4D is a schematic diagram showing the string current and panel currents flowing in a PV panel in an example power system.

In another embodiment of a wake-up operation, the controller 450 closes panel series switch 470 and determines the voltage across panel bypass switch 480, using voltage sensors 461, 462, 463 or an integrated voltage sensor or measurement capability. The controller 450 opens panel bypass switch 480 if the voltage is greater than a threshold value. FIG. 4D is a schematic diagram showing the string current and panel currents flowing in a PV panel in an example power system. The current flowing in panel bypass switch 480 is the difference between the string current $I_{STRING}$ and the panel current $I_{PANEL}$. When the voltage across panel bypass switch 480 is less than zero, this indicates that the string current is greater than the panel current. When the voltage across panel bypass switch 480 is zero, this indicates that the string current and panel current are equal. When the voltage across panel bypass switch 480 is positive, this indicates that the panel current is larger than string current. The polarity of the voltage measurement is indicated by the "+" and "−" signs on voltage sensors 461, 462, 463. With panel bypass switch 480 closed, the panel current is substantially equal to the short circuit current of the PV panel 410. The corresponding PV panel voltage at the short circuit current is zero. Thus, in one embodiment, the controller 450 opens panel bypass switch 480 and unbypasses the PV panel 410 when the voltage across panel bypass switch 480 is greater than zero. Under these conditions, the panel voltage of the unbypassed PV panel 410 will be greater than zero and the PV panel will contribute power to the power system.

Switchable Voltage Sensing

Figure 4E:
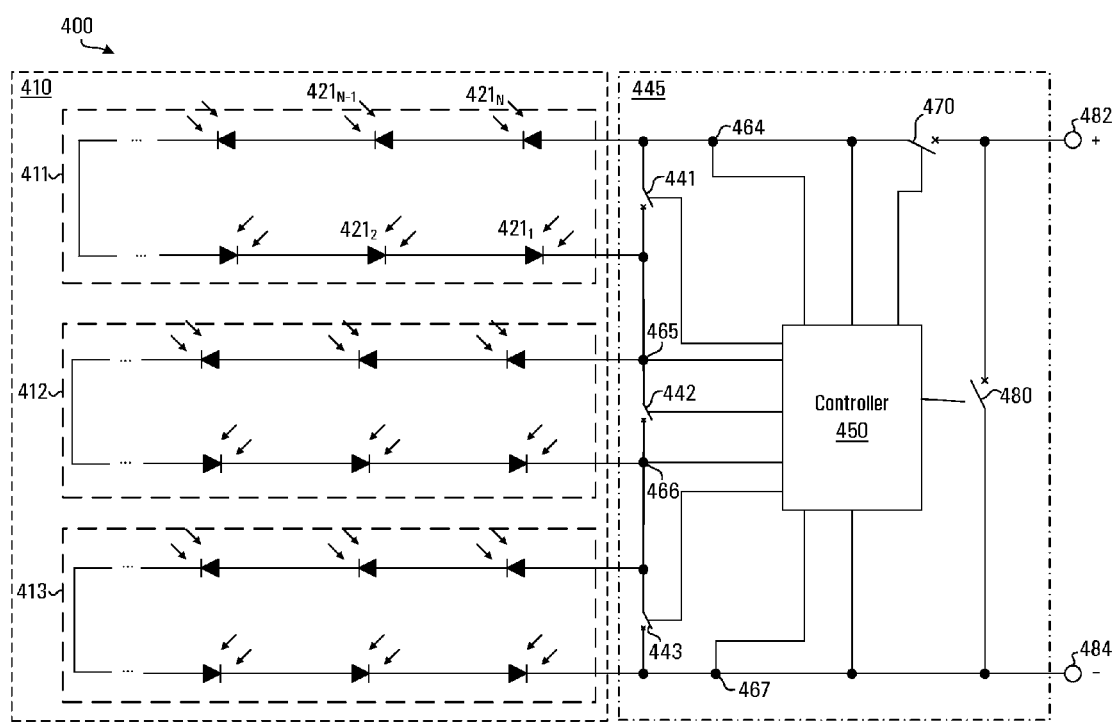
FIG. 4E is a schematic diagram of an example PV panel system which includes a PV panel and another bypass switching arrangement.

FIG. 4E is a schematic diagram of an example PV panel system 400, which includes a PV panel 410 and another bypass switching arrangement 445. In this embodiment voltmeters 461, 462 and 463 (FIGS. 4A, 4B, 4C, 4D) are absent and voltage sensors or a voltage measurement function are incorporated within controller 450. In this embodiment, the controller 450 measures the sub-string voltages through connections to voltage measuring points 464, 465, 466 and 467. In this embodiment, the voltage across a single sub-string, the voltage across two sub-strings in series, and/or the voltage across all sub-strings may be measured by connecting to the appropriate voltage sensing points using a switching means such as multiple controllable switches in the controller 450 or its connections to the voltage measuring points 464, 465, 466 and 467. For example, the combined voltage across sub-strings 411 and 412 may be measured between measurement points 464 and 466 or the combined voltage of all sub-strings may be measured between voltage sensing points 464 and 467. A similar arrangement could be used to measure the voltage across panel bypass switch 480 for the purposes of determining whether the PV panel 410 should be unbypassed. Thus, voltage sensing or measurement could be performed by separate voltage sensors 461, 462, 463 as shown in FIGS. 4A to 4D, or by the controller 450 itself as shown in FIG. 4E. The controller 450 might therefore determine a voltage by receiving a measured voltage from a voltage sensor or by measuring the voltage.

DC Power Optimization

Figure 5A:
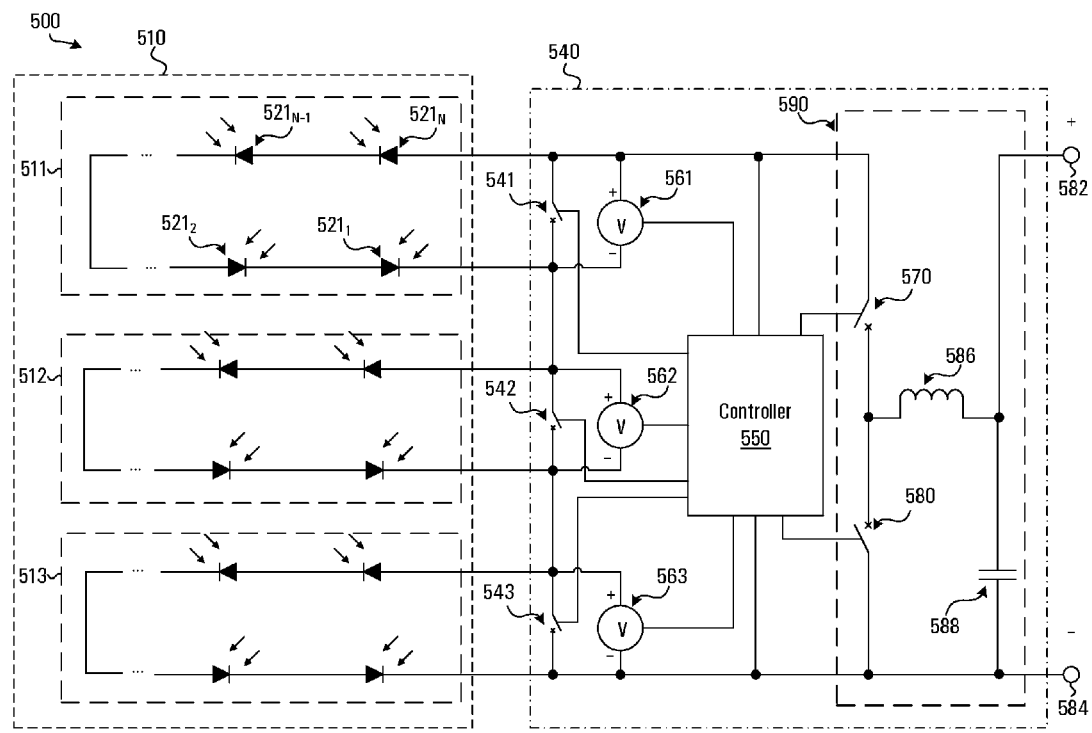
FIG. 5A is a schematic diagram of a further example PV panel system.

FIG. 5A is a schematic diagram of an alternate PV panel system 500, which includes a PV panel 510 and a DC Power Optimizer and Bypass switching arrangement (DC-POB) 540. The DC-POB 540 incorporates both DC optimizer and bypass diode functionality and is designed for the example PV panel 510, which has three PV cell sub-strings 511, 512, 513 in the example shown. Each sub-string 511, 512, 513 has N PV cells, labelled $521_1$, $521_2$, ..., $521_{N-1}$, $521_N$ for the sub-string 511. Other numbers of sub-strings are contemplated.

Sub-string bypass switches 541, 542, 543 are coupled across or between ends of (i.e., in parallel with) their respective sub-strings 511, 512, 513. Sub-string voltages $V_{SS,1}$, $V_{SS,2}$ and $V_{SS,3}$ are measured by respective voltage sensors 561, 562, 563, illustratively voltmeters, and the measured voltage values are received by a controller 550.

The controller 550 controls the operation of sub-string bypass switches 541, 542, 543.

582, 584 in FIG. 5A represent terminals through which a circuit path of the PV panel 510, in which the PV cells are connected, may connect to a power system. Such a power system could include multiple PV panel systems such as the example PV panel system 500 in FIG. 5A.

A DC Power optimizer uses a DC to DC converter to maximize the energy output of a PV panel. A DC Power optimizer also matches its current output to the string current. Although such terms as optimizer, optimize, maximize, and the like are used herein, these terms are not intended to infer absolute optimality or maxima. For instance, power optimization functionality may improve performance, but might not necessarily achieve theoretical maximum or optimal power production or output.

DC to DC converter 590, in the example shown, comprises switches 570 and 580, inductance 586 and capacitance 588. Converter 590 is a "buck" type converter and converts a DC input voltage at one level to a DC output voltage at another, lower level. Other types of DC to DC converter topologies are possible. The operation of converter 590 is controlled by controller 550. Switches 570 and 580 are switched with a frequency "F" and normally operate in a complementary fashion, such that when one switch is open (ON) the other switch will be closed (OFF).

When switch 570 is closed and switch 580 is open, current from panel 510 flows into inductance 586, storing energy in it. When switch 570 is opened and switch 580 is closed, the voltage across the inductance 586 reverses and it sources current into capacitance 588 and terminal 582. The duty cycle "D" of converter 590 is defined as ratio the ON time of switch 570 to the switching period T and is normally expressed as a percentage. The duty cycle may range from 0 to 100%. For example, if switch 570 is ON for 70% of the switching period then the duty cycle is 70%. The relationship of converter 590's output voltage $V_{OUT}$ to its input voltage $V_{IN}$ depends on the duty cycle and is given by the equation.

$$V_{OUT} = D \times V_{IN}$$

$V_{OUT}$ is defined as the voltage across capacitance 588 and $V_{IN}$ is defined as the voltage across the series combination of switches 570 and 580.

The relationship of the output current $I_{OUT}$ to the input current $I_{IN}$ also depends on the duty cycle and is given by the equation.

$$I_{OUT} = \frac{I_{IN}}{D}$$

Controller 550 operates converter 590 to maintain PV panel 510 at its Maximum Power Point (MPP) in an embodiment. The MPP of the panel 510 is the combination of its output voltage and current that results in the maximum output power. Controller 550 also operates converter 590 such that its output current matches the string current in an embodiment. String current flows into terminal 584 from other PV panel systems and out of terminal 582 to other PV panel systems.

Figure 6:
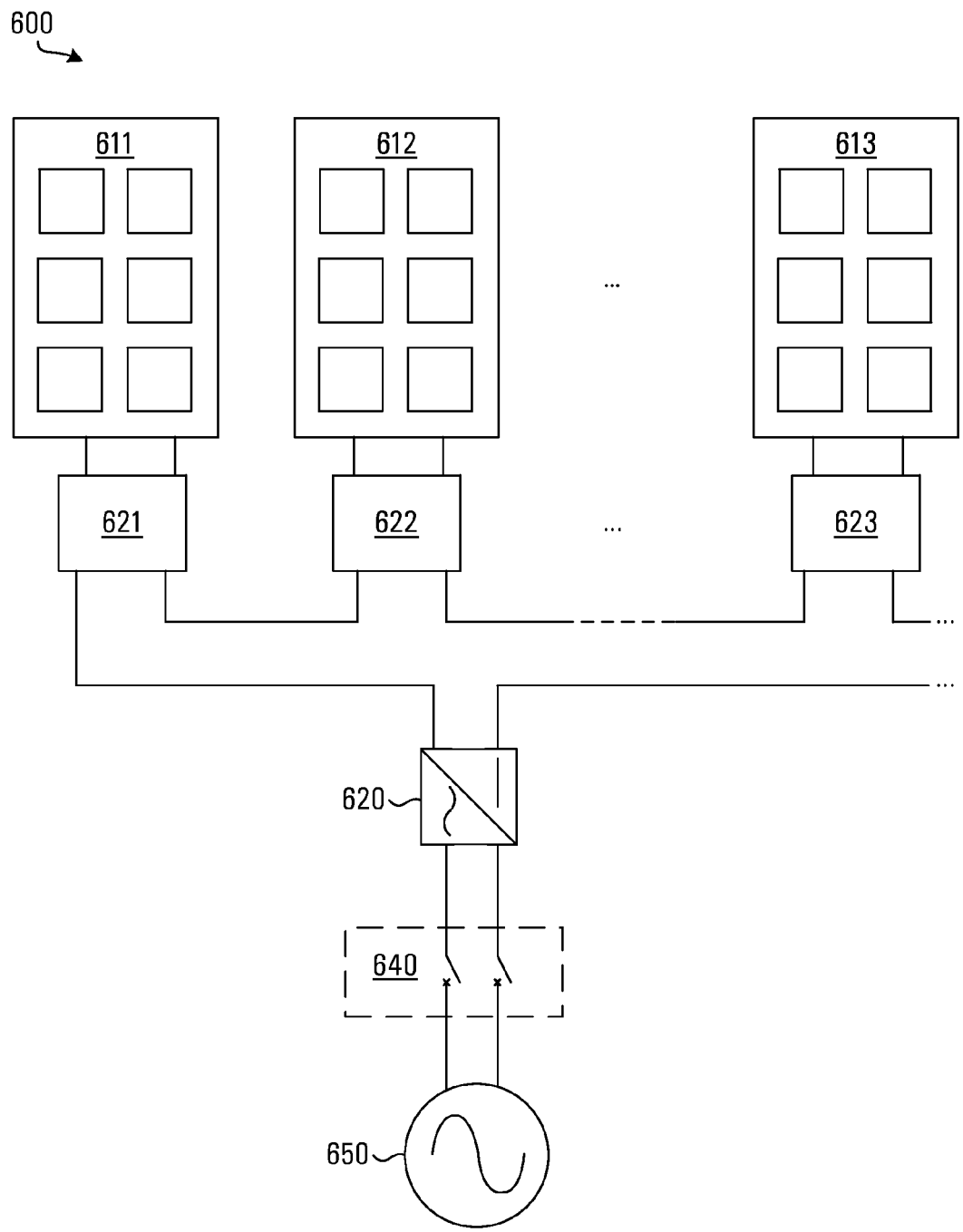
FIG. 6 is a block diagram of an example PV installation with DC-POBs.

FIG. 6 is a block diagram of an example power system with DC-POBs and multiple PV panel systems. Power system 600 comprises PV panels 611, 612, 613, DC-POBs 621, 622, 623, string inverter 620 and disconnect means 640, illustratively a set of disconnect switches. The output of the string inverter 620 connects to the electrical grid 650 through the disconnect means 640. The series connection of DC-POBs 621, 622, 623 constitutes a string. The string current $I_{STRING}$ will be set by string inverter 640. An individual DC-POB could set the current of its panel to the maximum power point current $I_{MPP}$ in an embodiment. The duty cycle of the converter is then $$D = \frac{I_{MPP}}{I_{STRING}}$$

For operation at the MPP, the input voltage to the DC-POB will be the maximum power point voltage $V_{MPP}$. The output voltage of the converter will therefore be $$V_{OUT} = D \times V_{IN} = D \times V_{MPP}$$

Thus the DC-POB is able to maintain the PV panel at the maximum power point and match its output current to the string current by varying its output voltage.

Referring again to FIG. 5A, the sub-string bypass switches 541, 542, 543, and converter switches 570, 580, may be implemented using any of a variety of means, including power Metal Oxide Semiconductor Field Effect Transistors (MOSFETS), Insulated Gate Bipolar Transistors (IGBTs), Thyristors, and/or relays, for example.

The DC-POB 540 performs a bypass function as well as a power optimization function. The controller 550 monitors measured values of the sub-string voltages received from the voltage sensors 561, 562, 563. On detection of a low voltage on a sub-string due to, for example, shading, the controller 550 closes that sub-string's bypass switch 541, 542, 543. In FIG. 5A for example, if the voltage difference across the sub-string 511 is low, then the controller 550 closes the bypass switch 541, shunting current around the sub-string and preventing the creation of harmful reverse voltages. The on-resistance of a MOSFET switch, for example, can be in the single milliohm (mΩ) range. Thus, the power dissipation of a MOSFET switch as the bypass switch 541 could be significantly lower than the power dissipation of a conventional bypass diode. For example, with a string current of 8 A and a MOSFET switch on-resistance of 1 mΩ, the power dissipation of the switch is only 64 mW, compared with bypass diode power dissipation of 5.6 W noted above under the same 8 A string current condition.

In one embodiment, the controller 550 closes a sub-string bypass switch 541, 542, 543 when the sub-string voltage across its connected sub-string 511, 512, 513 decreases below a certain sub-string bypass threshold value ($V_{SUB\_BY}$). In one embodiment, the value of $V_{SUB\_BY}$ is zero volts. In another embodiment, the controller 550 closes a sub-string bypass switch 541, 542, 543 when the sub-string voltage remains below a threshold value for longer than a specified time interval.

Sub-String Unbypassing with DC-POB

After a sub-string 511, 512, 513 has been bypassed by closing its bypass switch 541, 542, 543, the controller 550 may periodically check to determine whether the sub-string should be unbypassed by reopening its bypass switch. For example, the illumination of a bypassed sub-string may have changed sufficiently for it to be unbypassed, which the controller 550 could determine from one or more of the voltages measured by the voltage sensors 561, 562, 563. In one embodiment of sub-string unbypassing, the controller 550 periodically opens the previously closed sub-string bypass switch 541, 542, 543, and receives a measured sub-string voltage from a voltage sensor 561, 562, 563. In one embodiment, if the measured voltage has risen to above $V_{SUB\_BY}$ then the controller 550 keeps the sub-string bypass switch 541, 542, 543 open, and otherwise it recloses the bypass switch.

In another embodiment of sub-string unbypassing, the controller 550 determines the voltage across the closed sub-string bypass switch 541, 542, 543. If the voltage is greater than a threshold value, then the controller 550 unbypasses the sub-string by opening the sub-string bypass switch 541, 542, 543.

Figure 5B:
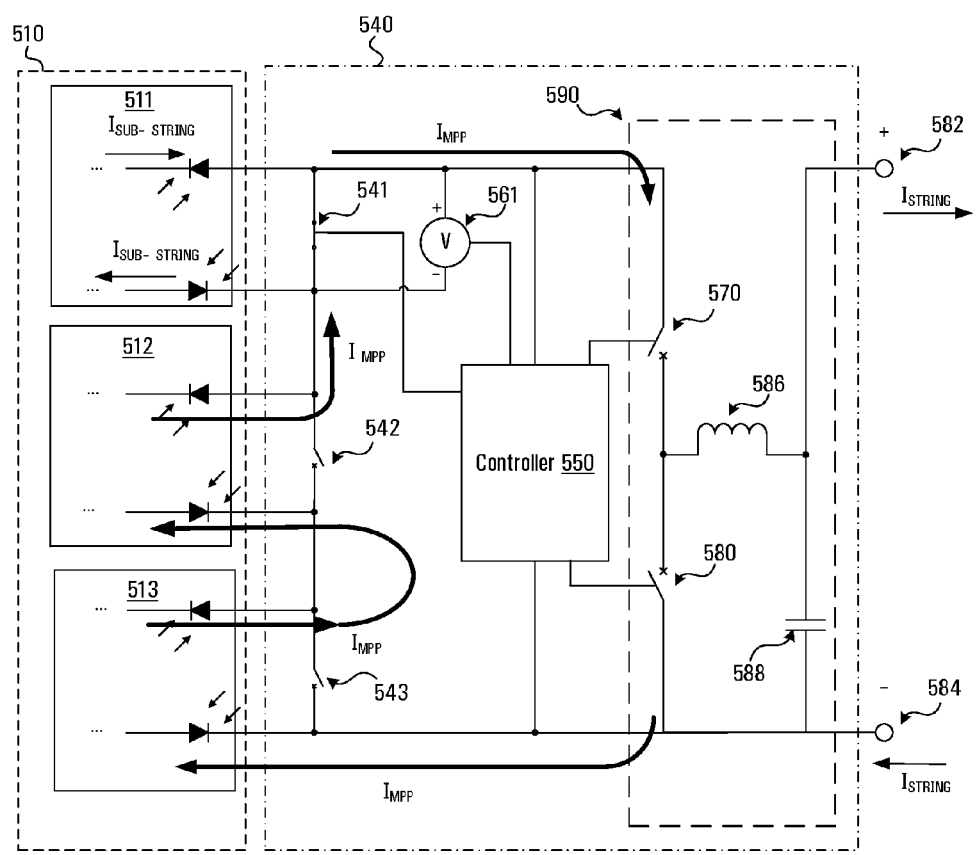
FIG. 5B is a schematic diagram showing the string current and Maximum Power Point (MPP) currents flowing in an example PV panel system with one substring bypassed.

FIG. 5B is a schematic diagram showing the string current and MPP currents flowing in an example PV panel system with one substring bypassed. PV panel 510 couples to a power system (not shown) through DC-POB 540. String current $I_{STRING}$ flows into terminal 584 and out of terminal 582. Sub-string bypass switch 541 is closed, shunting sub-string 511. The remaining sub-string bypass switches 542, 543 are open and their respective sub-strings 512, 513 are not bypassed. FIG. 5B relates to an example in which the sub-string 511 is bypassed, and therefore only the voltage sensor 561 is shown for the purposes of this particular example.

Bypass switch 541 is not an ideal switch and therefore has a small but finite resistance. Therefore there is a measurable voltage across it when it is closed and conducting current. This voltage could be beneficially used to determine when to unbypass sub-string 511. The current flowing in closed sub-string bypass switch 541 is the difference between the MPP current $I_{MPP}$ and the sub-string current $I_{SUB\text{-}STRING}$ of sub-string 511. The voltage across switch 541 could be measured by voltage sensor 561. When the voltage across sub-string bypass switch 541 is less than zero, this indicates that the MPP current is greater than the sub-string current. When the voltage across sub-string bypass switch 541 is zero, this indicates that the MPP current and the sub-string current are equal. When the voltage across sub-string bypass switch 541 is positive, this indicates that the sub-string current is larger than MPP current. With sub-string bypass switch 541 closed, the sub-string current of sub-string 511 is substantially equal to its short circuit current. The corresponding sub-string voltage at the short circuit current is zero. Thus, in one embodiment, the controller 550 opens sub-string bypass switch 541 and unbypasses the PV sub-string 511 when the voltage across sub-string bypass switch 541 is greater than zero. Under these conditions, the sub-string voltage across the unbypassed PV sub-string 511 will be greater than zero and the sub-string will contribute power to the power system.

Full PV Panel Bypass with DC-POB

Referring to FIG. 5A, the above sub-string bypass operation is suitable for bypassing up to two of the three sub-strings 511, 512, 513 in the example PV panel 510. Bypassing all of the sub-strings in a PV panel using sub-string bypass switches could be an issue where the controller 550 receives power for its operation from the PV panel 510. In the event that a low voltage were detected across all three sub-strings 511, 512, 513 in the example PV panel 510 and the bypass switches 541, 542, 543 were all to be closed, the output voltage of panel 510 might not be sufficient to power controller 550 and controller 550 might be unable to provide sufficient drive voltages to operate any of the switches 541, 542, 543, 570, 580.

In one embodiment, if the sum of the sub-string voltages (the panel voltage) as measured by the voltage sensors 561, 562, 563 is below a threshold value ($V_{P\_BY}$), then the controller 550 closes switch 580 and opens switch 570 and sub-string bypass switches 541, 542, 543 to disconnect the panel from the string. The voltage across the PV panel circuit path in which the PV cells are connected could then rise to a sufficient level to power controller 550 for its operation even when the PV panel is weakly illuminated. In one embodiment, $V_{P\_BY}$ corresponds to a minimum operating voltage of the controller 550. In this embodiment the duty cycle of converter 590 is substantially zero and the converter is essentially turned off.

Figure 5C:
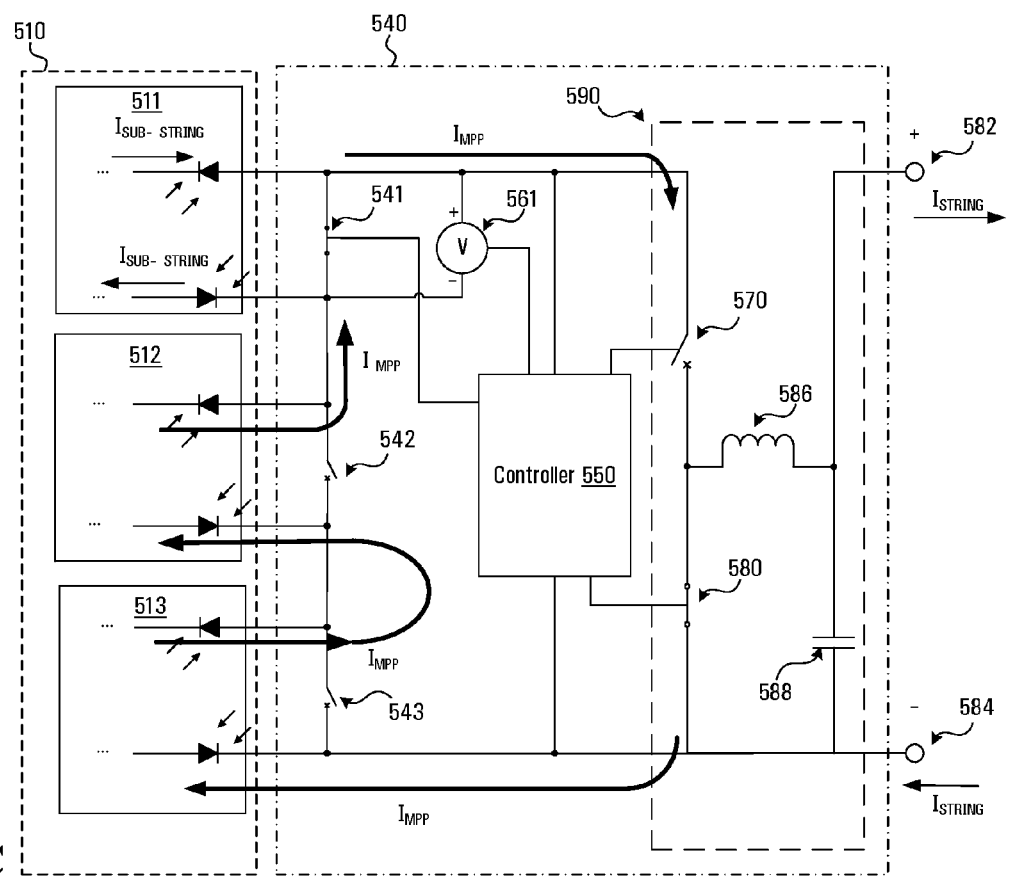
FIG. 5C is a schematic diagram showing a PV panel fully bypassed with respect to the string by a DC Power Optimizer and Bypass switching arrangement (DC-POB).

FIG. 5C is a schematic diagram showing panel 510 fully disconnected from the string by DC-POB 540. In this embodiment, the example PV panel 510 is disconnected from terminals 582, 584 and thus from other PV panels in a power system PV panel string by the open switch 570. Panel 510 is bypassed with respect to the string and the string current produced by other panels in the string runs through closed switch 580 and inductance 586. The parasitic resistance of inductance 586 is preferably chosen to be small enough to minimize power losses. Sub-string bypass switches 541, 542, 543 are all open.

PV Panel Reconnect with DC-POB

After a PV panel has been completely bypassed and disconnected from the string, the controller 550 could periodically check to determine whether the PV panel should be reconnected, as a result of a change in illumination for instance. In one embodiment of this type of "wake-up" operation, the controller 550 monitors the panel voltage and restarts converter 590 when the panel voltage meets or exceeds an threshold value. Switches 570 and 580 resume switching with a non-zero duty cycle.

Switchable Voltage Sensing

Figure 5D:
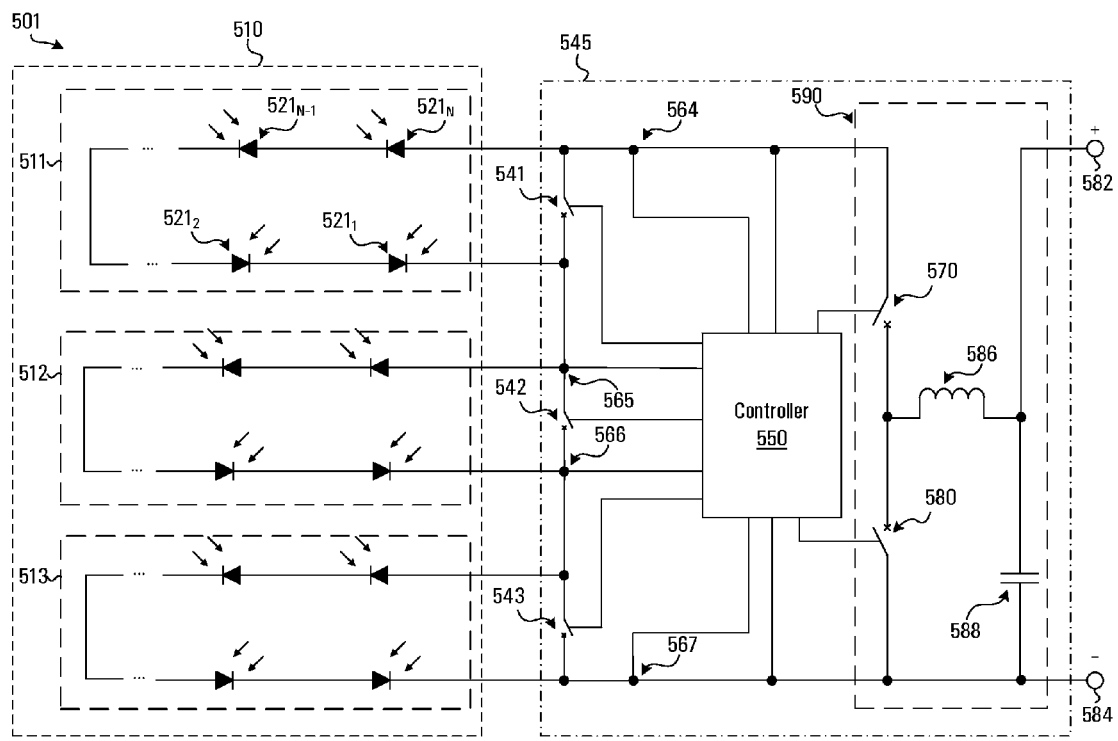
FIG. 5D is a schematic diagram of an example PV panel system containing another embodiment of a DC-POB.

FIG. 5D is a schematic diagram of an example PV panel system containing another embodiment of a DC-POB. PV panel system 501 includes a PV panel 510 and DC-POB 545. In this embodiment voltmeters 561, 562 and 563 (FIGS. 5A, 5B, 5C) are absent and voltage sensors or a voltage measurement function are incorporated within controller 550. In this embodiment, the controller 550 measures the sub-string voltages through connections to voltage measuring points 564, 565, 566 and 567. In this embodiment, the voltage across a single sub-string, the voltage across two sub-strings in series, and/or the voltage across all sub-strings may be measured by connecting to the appropriate voltage sensing points using a switching means such as multiple controllable switches in the controller 550 or its connections to the voltage measuring points 564, 565, 566 and 567. For example, the combined voltage across sub-strings 511 and 512 may be measured between measurement points 564 and 566 or the combined voltage of all sub-strings may be measured between voltage sensing points 564 and 567. A similar arrangement could be used to measure the voltage across switch 580 and/or terminals 582 and 584. Thus, voltage sensing or measurement could be performed by separate voltage sensors 561, 562, 563 as shown in FIGS. 5A to 5C, or by the controller 550 itself as shown in FIG. 5D. The controller 550 might therefore determine a voltage by receiving a measured voltage from a voltage sensor or by measuring the voltage.

Controller/Switch Examples

Figure 6A:
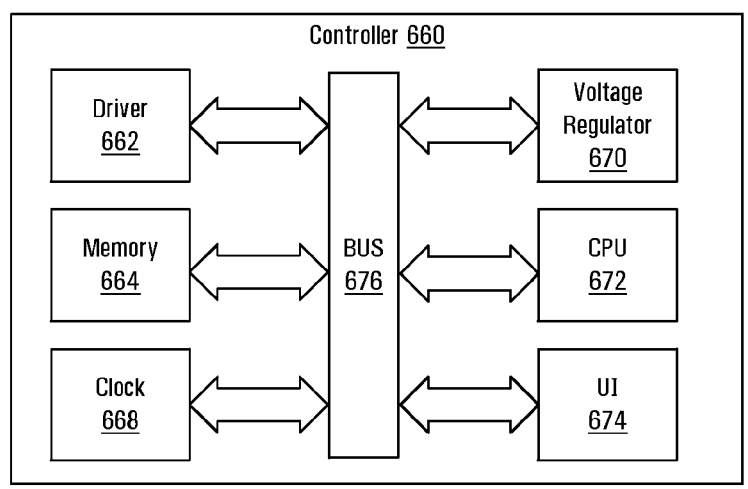
FIG. 6A is a block diagram of an example controller.

FIG. 6A is a block diagram an example controller 660, which could be implemented as the controller 450, 550. A voltage regulator 670 converts variable PV panel output voltage to a constant controller supply voltage in an embodiment. A switch driver 662 supplies drive signals to the sub-string bypass switches 441, 442, 443 and to switches 470 and 480 of FIGS. 4A to 4E or to sub-string bypass switches 541, 542, 543 and to switches 570 and 580 of FIGS. 5A to 5D to control their opening and closing. Firmware for the operation of the example controller 660 is stored in memory 664. In one embodiment, the memory 664 is non-volatile memory such as Flash, Electrically Erasable Programmable Read Only Memory (EEPROM), EPROM, ROM. The firmware is executed on a Central Processing Unit (CPU) 672 in the example shown. A clock 668 controls the internal timing of the controller operation. A user Interface (UI) 674 is provided, for example, to communicate the operating status of the bypass switching arrangement to a user. These components are interconnected with each other by control and data bus 676 as shown, in an embodiment.

In one embodiment, the UI 674 consists of Light Emitting Diodes (LEDs) which indicate the state (open or closed) of switches 441, 442, 443 (FIGS. 4A to 4E) or the state of switches 541, 542, 543 (FIGS. 5A to 5D) by their color and illumination. In another embodiment, the LEDs indicate a fault within a sub-string 511, 512, 513 or the PV panel 510 (FIGS. 5A to 5D) or within a sub-string 411, 412, 413 or the PV panel 410 (FIGS. 4A to 4E), such as an open circuit in a sub-string. In another embodiment, the LEDs indicate the bypass switch state of panel 410, 510 (no sub-strings bypassed, one sub-string bypassed, two sub-strings bypassed, PV panel completely bypassed and switch 480, 580 closed).

Basic operation of a PV panel bypass switching arrangement is described above. Additional features could be provided in some embodiments to accommodate certain operating conditions.

In some situations of extremely weak or no illumination, the example PV panel 410, 510 might not be able to generate sufficient power to operate controller 450, 550. To provide for this eventuality, in one embodiment, switch 480, 580 is implemented using a power MOSFET. A power MOSFET has a naturally occurring "built-in" diode formed between the MOSFET's body and drain. FIG. 6B is a schematic diagram of a power MOSFET as an example controllable switch. The example in FIG. 6B is an N type MOSFET 682, and its built-in diode is separately shown at 684. The built-in diode 684 is across the MOSFET source and drain terminals (i.e., in parallel with the main conduction path of the MOSFET 682). In the event that controller 450, 550 does not have enough power to drive the MOSFET 682 into conduction, the built-in diode 684 will become forward biased. The built-in diode 684 will conduct the string current when the example MOSFET of FIG. 6B is implemented as switch 480 (FIGS. 4A to 4E) or as switch 580 (FIGS. 5A to 5D). In another embodiment, a discrete diode is placed in parallel with switch 480, 580 and performs in a similar fashion. FIG. 6C is a schematic diagram of such a controllable switch, including switch 686 with a parallel diode 688.

Controller Supply Voltage Stabilization and Power Harvesting

The voltage that is supplied to a controller 450, 550 could fluctuate significantly if the PV panel 410, 510 is heavily shaded and/or operating under other non-optimal conditions or is in the process of being unbypassed. For instance, in FIG. 4C, with the panel series switch 470 open and the panel bypass switch 480 closed, the PV panel 410 is essentially open circuited and its voltage could be tens of volts, even if it is heavily shaded or otherwise subjected to relatively low illumination. When the panel series switch 470 closes and the panel bypass switch 480 opens to unbypass the panel, the string current is forced through the PV panel 410. If the PV panel 410 is still heavily shaded, for instance, then the panel voltage will drop rapidly, perhaps to below the minimum operating voltage of the controller 450. In one embodiment, the voltage supplied to the controller is stabilized against fluctuations from unbypassing the panel.

Figure 7A:
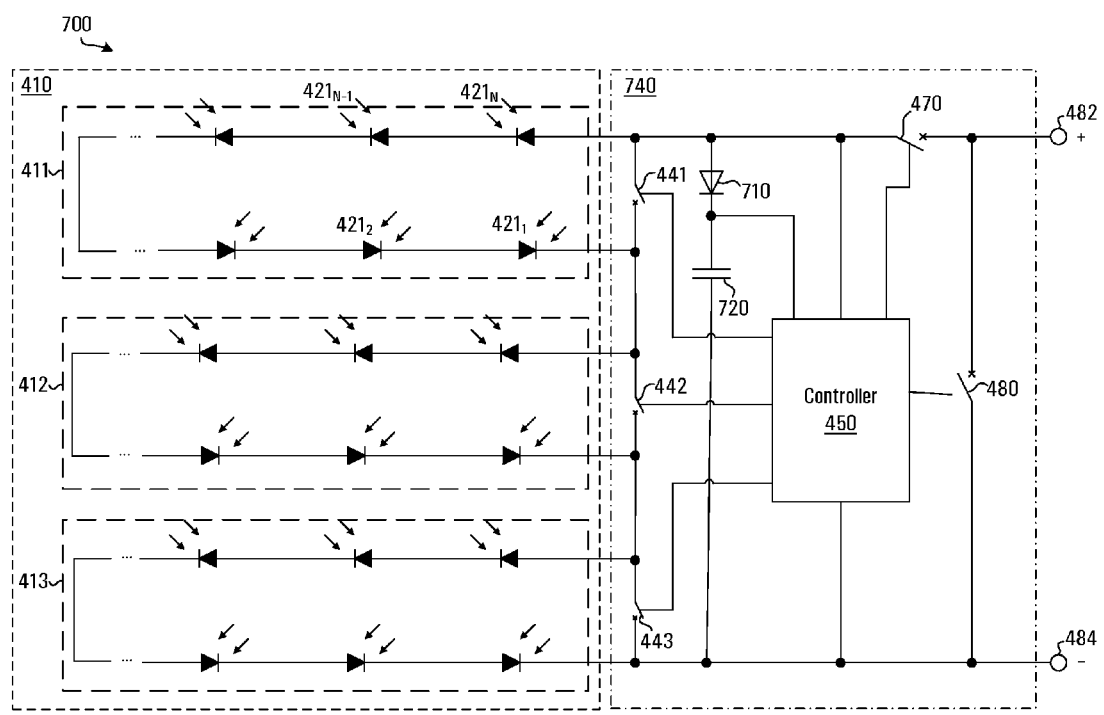
FIG. 7A is a schematic diagram of another example PV panel system.

FIG. 7A is a schematic diagram of another example PV panel system 700, which incorporates an embodiment of controller voltage supply stabilization in its bypass switching arrangement 740. The voltage sensors 461, 462, 463 (FIGS. 4A to 4D) have not been shown in FIG. 7A in order to avoid congestion in the drawing. A diode 710 and capacitance 720 are connected in a circuit path across the circuit path of the PV panel in which the PV cells are connected. The controller 450 receives a supply voltage from the capacitance 720. The capacitance 720 is charged, through the diode 710, to the PV panel output voltage while the PV panel 410 is bypassed. If the PV panel output voltage falls when the panel bypass switch 480 is opened and the panel series switch 470 is closed due to string current being forced through the sub-strings 411, 412, 413, then the diode 710 will become reverse biased and prevent the capacitance 720 from discharging. The voltage supplied to the controller 450 will therefore remain relatively constant and only decrease as the controller draws current from the capacitance 720. The capacitance 720 is sized such that it can supply sufficient power to the controller 450 for the controller to complete the wake-up operation.

Figure 7B:
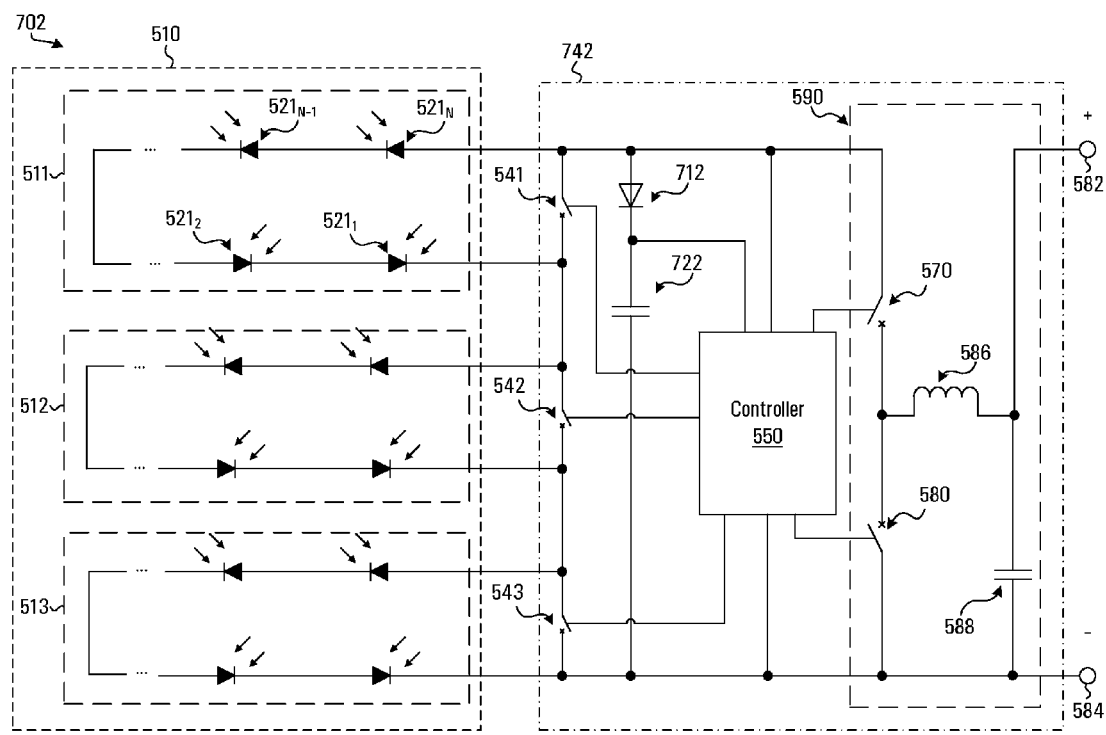
FIG. 7B is a schematic diagram of another example PV panel system.

FIG. 7B is a schematic diagram of another example PV panel system 702, which also incorporates an embodiment of controller voltage supply stabilization in its bypass switching arrangement 742. The voltage sensors 561, 562, 563 (FIGS. 5A to 5D) of DC-POB 540 have not been shown in FIG. 7B in order to avoid congestion in the drawing. A diode 712 and capacitance 722 are connected in a circuit path across the PV panel 510. The controller 550 receives a supply voltage from the capacitance 720. The capacitance 720 is charged, through the diode 710, to the PV panel output voltage less a diode voltage drop. In the case of a sudden shadowing of the panel, the panel voltage may collapse to a low value, below the minimum operating voltage of the controller 550. In this case diode 710 will become reverse biased and capacitance 720 will supply power to the controller to prevent it immediately turning off. This will allow the controller 550 sufficient time to find the new MPP point of the panel for the shadowed condition, for example.

In another embodiment, a voltage stabilization circuit is used to harvest additional power from PV panel 410, 510. A PV panel conducting string current continues to supply power to the power system so long as its voltage remains positive. In some situations, the PV panel voltage may still be positive but less than the voltage needed to supply the controller 450, 550. Bypassing the PV panel 410, 510 while its voltage is still positive, in order to ensure that controller 450, 550 is supplied with its minimum operating voltage, could result in lost power.

Figure 7C:
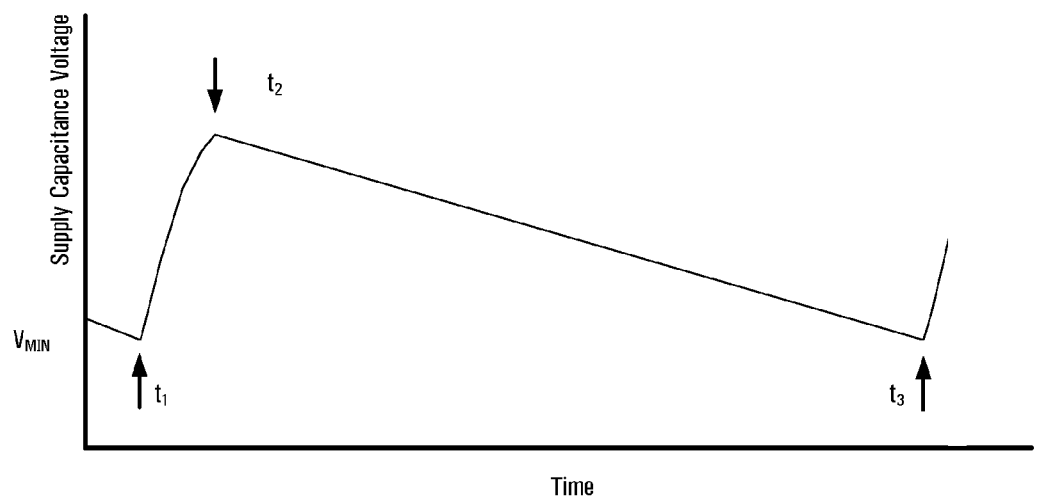
FIG. 7C is an example plot of the voltage of the supply capacitance versus time.

In one embodiment, referring to FIG. 7B, controller 550 monitors the value of the voltage on capacitance 722. FIG. 7C is an example plot of the voltage of the supply capacitance 720, 722 versus time. At time $t_1$ the capacitance voltage becomes equal to a minimum voltage $V_{MIN}$ and controller 550 turns off DC to DC converter 590 by opening switch 570 and closing switch 580 and stopping any further switching. This disconnects PV panel 510 from the string and causes the PV panel voltage to rise. Even under heavily shaded or otherwise reduced insolation conditions, the open circuit voltage of the PV panel 510 can easily be tens of volts and sufficient to power controller 550. The PV panel voltage will forward bias diode 712 and capacitance 722 will charge to the PV panel voltage less the diode drop across diode 712. At time $t_2$ in FIG. 7C the voltage has risen to a sufficient level such that controller 550 restarts converter 590.

The PV panel voltage will then drop as converter 590 draws power from it. Diode 712 then becomes reverse biased but capacitance 722 remains at its previous voltage. After time $t_2$ the voltage of capacitance 722 slowly drops as controller 550 continues to operate and draw current. At time $t_3$ in FIG. 7C the voltage of capacitance 722 has again dropped to $V_{MIN}$ and the cycle repeats. The plot shown in FIG. 7C is solely for illustrative purposes. Similar or different voltage/time characteristics could be observed in other embodiments or implementations.

A similar harvesting scheme may be employed to harvest additional power from panel 410 (FIGS. 4A to 4E) during periods of low insolation. In one embodiment, referring to FIG. 7A, controller 450 monitors the value of the voltage on capacitance 720. At time $t_1$, referring to FIG. 7C, the capacitance voltage becomes equal to a minimum voltage $V_{MIN}$ and controller 450 opens switches 470, 441, 442 and 443 and closes switch 480. This disconnects PV panel 410 from the string and the PV panel voltage will rise to the open circuit voltage of the PV panel. Even under heavily shaded or otherwise reduced insolation conditions, the open circuit voltage of the PV panel 410 can easily be tens of volts, sufficient to power controller 450. The PV panel voltage will forward bias diode 710 and capacitance 720 will charge to the PV panel voltage less the diode drop across diode 710. Controller 450 opens panel bypass switch 480 and closes panel series switch 470 once capacitance 720 is charged to a sufficient voltage. This occurs at time $t_2$ in FIG. 7C. In one embodiment, this is substantially the PV panel open circuit voltage. The PV panel voltage will drop as the string current passes through it, however it will continue to supply power to the power system as long as its voltage remains positive. Diode 710 becomes reverse biased but capacitance 720 remains charged at the open circuit panel voltage. After time $t_2$ the voltage of capacitance 720 slowly drops as controller 450 continues to operate and draws current. At time $t_3$ in FIG. 7C the voltage of capacitance 720 has again dropped to $V_{MIN}$ and the cycle repeats. The plot shown in FIG. 7C is solely for illustrative purposes. Similar or different voltage/time characteristics could be observed in other embodiments or implementations.

Overview

PV panel bypass switching features are disclosed above. With reference again to FIGS. 4A to 4E and 7A, but in a somewhat more general sense, a panel bypass switching arrangement such as 440, 445, 740 could include a first switch 470 and a second switch 480. The first switch 470 is to be coupled between a power system and a first end of a circuit path of a PV panel 410 in which PV cells of the PV panel are connected, and the first switch is controllable to connect the first end of the circuit path of the PV panel to a power system and to disconnect the first end of the circuit path of the PV panel from the power system. The second switch 480 is to be coupled between (i) a point between the first switch 470 and the power system and (ii) a point between a second end of the circuit path of the PV panel 410 and the power system. The second switch 480 is controllable to open and close a bypass circuit path that bypasses the circuit path of the PV panel 410.

A controller 450 is operatively coupled to the first switch 470 and to the second switch 480, to determine whether the circuit path of the PV panel 410 is to be bypassed, and to control the first and second switches based on the determination.

A PV panel bypass switching arrangement could also include a voltage sensor 461, 462, 463, to be coupled to measure a voltage difference across PV cells in the circuit path of the PV panel 410. In the examples shown in FIGS. 4A, 4C and 4D, there are multiple voltage sensors 461, 462, 463, although in other embodiments there could be more or fewer voltage sensors. The controller 450 is coupled to voltage sensor(s) 461, 462, 463 to determine whether the circuit path of the PV panel 410 is to be bypassed, based on the voltage difference(s) measured by the voltage sensor(s).

In an embodiment, a single voltage sensor is to be switchably coupled between respective voltage measuring points 464, 465, 466, 467 (FIG. 4E) in the circuit path of the PV panel.

As described in detail herein, the controller 450 could determine whether each respective PV cell sub-string 411, 412, 413 in the circuit path of the PV panel 410 is to be bypassed, and to control PV cell sub-string switches 441, 442, 443 that are coupled across the respective PV cell sub-strings, based on the determination.

In some embodiments, a power connection between the controller 450 and the first switch 470 provides power to the controller from the PV panel 410. The power connection could include a voltage stabilization circuit, which in the example shown in FIG. 7A includes the diode 710, with its anode coupled to the first switch 470 and its cathode coupled to a power input of the controller 450, and the capacitance 720 couples the cathode of the diode to the second end of the circuit path of the PV panel 410.

When a PV panel or sub-string has been bypassed, the controller 450 could subsequently determine whether the PV panel or sub-string should be reconnected. For instance, where the controller 450 is configured to open the panel series switch 470 and close the panel bypass switch 480 responsive to determining that the circuit path of the PV panel 410 is to be bypassed, it could subsequently close the panel series switch and open the panel bypass switch and determine whether the PV panel 410 is to be reconnected to the power system based on one or more voltage difference(s) measured by the voltage sensor(s) while the first switch is closed and the second switch is open, and control the first and second switches based on the further determination.

In an embodiment, the controller 450 determines whether the PV panel is to be reconnected to the power system based on a voltage difference across the panel bypass switch 480 while that switch is closed, as described in detail above. For PV cell sub-strings, after a sub-string switch 441, 442, 443 has been closed, the controller 450 could determine whether the PV cell sub-string is to be reconnected based on a voltage difference across the PV cell sub-string switch while the PV cell sub-string switch is closed. In another embodiment, after a PV cell sub-string is bypassed, the controller 450 subsequently opens the PV cell sub-string switch and further determines whether the PV cell sub-string is to be reconnected based on the voltage difference measured across the PV cell sub-string by the voltage sensor while PV cell sub-string switch is open, and to control the PV cell sub-string switch of the PV cell sub-string based on the determination of whether the PV cell sub-string is to be reconnected PV panel DC power optimization and bypass switching features are also disclosed above. With reference again to FIGS. 5A to 5D and 7B, but in a somewhat more general sense, a DC power optimization and bypass switching arrangement could include a first switch 570 and a second switch 580. The first switch 570 is to be coupled between a power system and a first end of a circuit path of a PV panel 510 in which PV cells of the PV panel are connected, and the first switch is controllable to connect the first end of the circuit path of the PV panel to a power system and to disconnect the first end of the circuit path of the PV panel from the power system. The second switch 580 is to be coupled between (i) a point between the first switch 570 and the power system and (ii) a point between a second end of the circuit path of the PV panel 510 and the power system. The second switch 580 is controllable to open and close a bypass circuit path that bypasses the circuit path of the PV panel 510. A controller 550 is operatively coupled to the first switch 570 and to the second switch 580, to determine whether the circuit path of the PV panel 510 is to be bypassed, and to control the first and second switches based on the determination.

The example PV panel switching arrangements 540, 545, 742 in FIGS. 5A to 5D and 7B include a DC converter 590, which would be coupled between a power system and a circuit path of the PV panel 510 in which a plurality of PV cells of the PV panel are connected. The DC converter 590 includes the first switch 570 and the second switch 580. The example PV panel switching arrangements 540, 545, 742 also include a controller 550 operatively coupled to the first switch 570 and to the second switch 580, to determine whether the circuit path of the PV panel 510 is to be bypassed and to control the first and second switches for DC conversion of PV panel output on a determination that the circuit path of the PV panel is not to be bypassed. In an embodiment, the controller 550 is also configured to control the first switch to disconnect the first end of the circuit path of the PV panel from the power system and the second switch to close a bypass circuit path that bypasses the circuit path of the PV panel on a determination that the circuit path of the PV panel is to be bypassed.

A switching arrangement could also include a voltage sensor 561, 562, 563, to be coupled to measure a voltage difference across PV cells in the circuit path of the PV panel 510. In the example shown in FIG. 5A there are multiple voltage sensors 561, 562, 563, although in other embodiments there could be more or fewer voltage sensors. The controller 550 is coupled to the voltage sensors(s) 561, 562, 563 to determine whether the circuit path of the PV panel 510 is to be bypassed, based on the voltage difference(s) measured by the voltage sensors(s).

In an embodiment, a single voltage sensor is to be switchably coupled between respective voltage measuring points 564, 565, 566, 567 (FIG. 5D) in the circuit path of the PV panel 510.

As described in detail herein, the controller 550 could determine whether each respective PV cell sub-string 511, 512, 513 in the circuit path of the PV panel 510 is to be bypassed, and to control PV cell sub-string switches 541, 542, 543 that are coupled across the respective PV cell sub-strings, based on the determination.

In some embodiments, a power connection between the controller 550 and the PV panel 510 provides power to the controller from the PV panel 510. The power connection could include a voltage stabilization circuit, which in the example shown in FIG. 7B includes the diode 710, with its anode coupled to the first switch 570 and its cathode coupled to a power input of the controller 550, and the capacitance 720 couples the cathode of the diode to the second end of the circuit path of the PV panel 510.

When a PV panel or sub-string has been bypassed, the controller 550 could subsequently determine whether the PV panel or sub-string should be reconnected. For instance, where the controller 550 is configured to open switch 570 and close switch 580 responsive to determining that the PV panel 510 is to be bypassed, it could subsequently determine whether the PV panel is to be reconnected to the power system through DC to DC converter 590 based on one or more voltage difference(s) measured by the voltage sensor(s) while the first switch is closed and the second switch is open, and control the first and second switches based on the further determination.

In an embodiment, the controller 550 determines whether the PV panel is to be reconnected to the power system based on a voltage difference across the PV panel. For PV cell sub-strings, after a sub-string switch 541, 542, 543 has been closed, the controller 550 could determine whether the PV cell sub-string is to be reconnected based on a voltage difference across the PV cell sub-string switch while the PV cell sub-string switch is closed. In another embodiment, after a PV cell sub-string is bypassed, the controller 550 subsequently opens the PV cell sub-string switch and further determines whether the PV cell sub-string is to be reconnected based on the voltage difference measured across the PV cell sub-string by the voltage sensor while PV cell sub-string switch is open, and to control the PV cell sub-string switch of the PV cell sub-string based on the determination of whether the PV cell sub-string is to be reconnected.

Responsive to a determination that the PV panel 510 is to be reconnected to the power system, the controller 550 controls the switches 570, 580 for DC conversion, in embodiments that include the DC converter 590.

The DC converter 590 is a buck converter in the examples shown in FIGS. 5A to 5D and 7B, and includes an inductance 586 coupled between the first switch 570 and a first terminal 582 through which the DC converter is to be coupled to the power system, and a capacitance 588 coupled between the first terminal 582 and a second terminal 584 through which the DC converter is to be coupled to the power system. Other DC converter types are possible.

As noted above, control of the switches 570, 580 for DC conversion could maintain the PV panel 510 at its maximum power point. This type of MPP tracking could be achieved by controlling a duty cycle of switching the first switch 570 in the DC conversion.

FIGS. 4A to 4E, 5A to 5D, 7A and 7B, show the PV panel 410, 510 and the PV panel bypass switching arrangement 440, 445, 540, 545, 740, 742 as separate components. A PV panel system 400, 401, 500, 501, 700, 702 could include both of these components. In some embodiments, the bypass switching arrangement 440, 445, 540, 545, 740, 742 could be integrated into a PV panel. In some embodiments, the bypass switching arrangement could be integrated into a junction box of the PV panel. If the PV panel 410, 510 and the PV panel bypass switching arrangement 440, 445, 540, 545, 740, 742 are manufactured or otherwise provided separately, then components of the PV panel bypass switching arrangement are to be connected or coupled to a PV panel and power system as described herein. In an integrated package or product, or after installation of separately provided components, for example, these connections may already be in place.

Example Methods

Figures 8, 9:
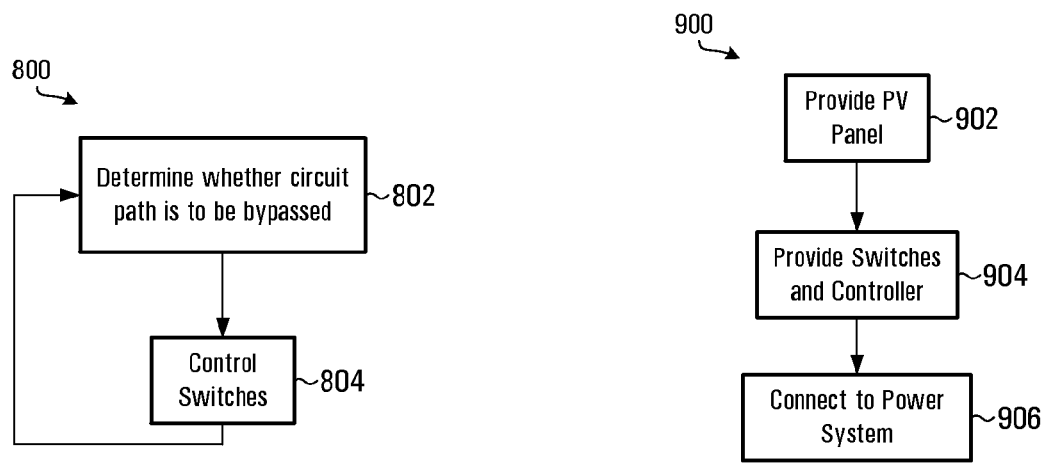
FIG. 8 is a flow diagram of an example method.
FIG. 9 is a flow diagram of another example method.

Embodiments are disclosed above primarily in the context of example PV panel systems. Other embodiments, including methods for instance, are also contemplated. FIG. 8 is a flow diagram of an example method.

The example method 800 involves determining at 802 whether a circuit path of a PV panel, in which PV cells are connected, is to be bypassed. At 804, a first switch (e.g., 470 in FIGS. 4A to 4E and 7A or 570 in FIGS. 5A to 5D and 7B) coupled between a power system and a first end of the circuit path of the PV panel is controlled, to connect the first end of the circuit path of the PV panel to a power system or to disconnect the first end of the circuit path of the PV panel from the power system based on the determination at 802. The control at 804 also involves controlling, based on the determination at 802, the second switch (e.g., 480 in FIGS. 4A to 4E and 7A or 580 in FIGS. 5A to 5E and 7B) coupled between (i) a point between the first switch and the power system and (ii) a point between a second end of the circuit path of the PV panel and the power system, to open or close a bypass circuit path that bypasses the circuit path of the PV panel. Controlling of the switches at 804 could involve maintaining one or both of the switches in its current open or closed state, and/or changing the state of one or both of the switches. It should be understood that the meaning of connect and disconnect and open and close in this context is to be distinguished from the normal switching operation of a DC to DC converter in which switches 570 and 580 of FIG. 5A to 5D and FIG. 7B are alternately opened and closed at the operating frequency of the converter.

The example method 800 is illustrative of one embodiment. Examples of additional operations that may be performed, such as measuring voltages, bypassing PV cell sub-strings, and/or reconnecting a bypassed PV panel or PV cell sub-string, will be apparent from the description and drawings relating to apparatus and system implementations, for example. Further variations may be or become apparent.

One such variation relates to voltage stabilization as described herein with reference to FIGS. 7A to 7C. In the case of PV panel bypass switching arrangement 440, 445, 740 voltage stabilization could involve opening the panel series switch 470 and closing the panel bypass switch 480 when the capacitance 720 (FIG. 7A) discharges to a first voltage, illustratively the minimum operating voltage of the controller 450, and then charging the capacitance. The diode 710 becomes forward biased, and the capacitance 720 charges to a second voltage above the first voltage. This second voltage could be as high as the PV panel 410 open circuit voltage less the voltage drop across the diode 710. The next stage of voltage stabilization involves closing the panel series switch 470 and opening the panel bypass switch 480 when the capacitance 720 charges to the second voltage. The PV panel 410 could thus be cyclically bypassed, its voltage then rises and charges the capacitance 720, the PV panel 410 is reconnected and the capacitance has enough stored charge to power the controller 450 for some time, and then the cycle repeats again. This mechanism can be quite useful in that it enables "harvesting" of energy while keeping the controller 450 powered even under low output voltage conditions.

In the case of PV panel bypass switching arrangement 540, 545, 742 in FIGS. 5A to 5D and 7B, voltage stabilization could involve halting the switching of switches 570 and 580 when the capacitance 720 (FIG. 7B) discharges to a first voltage, illustratively the minimum operating voltage of the controller 550, and then charging the capacitance. The diode 712 becomes forward biased, and the capacitance 722 charges to a second voltage above the first voltage. This second voltage could be as high as the PV panel 510 open circuit voltage less the voltage drop across the diode 712. The next stage of voltage stabilization involves resuming switching of switches 570 and 580 when the capacitance 722 charges to the second voltage.

In this embodiment the DC to DC converter 590 is turned off causing the PV panel voltage to rise and charge the capacitance 722, the DC to DC converter 590 is then restarted and the capacitance has enough stored charge to power the controller 550 for some time, and then the cycle repeats again. This mechanism can be quite useful in that it enables "harvesting" of energy while keeping the controller 550 powered even under low output voltage conditions.

Another variation relates to embodiments that provide DC conversion. Such a method could include the determining at 802 whether a circuit path of a PV panel, in which a plurality of PV cells of the PV panel are connected, is to be bypassed. Switch control at 804 could involve controlling first and second switches of a DC converter for DC conversion of PV panel output on determining that the circuit path of the PV panel is not to be bypassed. The first switch is coupled between a power system and a first end of the circuit path of the PV panel, and the second switch is coupled between (i) a point between the first switch and the power system and (ii) a point between a second end of the circuit path of the PV panel and the power system. Switch control at 804 could also involve controlling the first switch to disconnect the first end of the circuit path of the PV panel from the power system on determining that the circuit path of the PV panel is to be bypassed, and controlling the second switch to close a bypass circuit path that bypasses the circuit path of the PV panel on determining that the circuit path of the PV panel is to be bypassed.

FIG. 9 is a flow diagram of another example method 900, which relates to manufacturing, building, and/or installing a PV panel system. The example method 900 involves providing a PV panel at 902. The PV panel includes a circuit path in which PV cells are connected. At 904, switches and a controller are provided. The switches include a first switch (e.g., 470 in FIGS. 4A to 4E and 7A) to switchably connect a first end of the circuit path of the PV panel to a power system, and a second switch (e.g., 480 in FIGS. 4A to 4E and 7A) to switchably connect (i) a point between the first switch and the power system and (ii) a point between a second end of the circuit path and the power system. A controller is provided at 904 to determine whether the circuit path of the PV panel is to be bypassed and to control the first and second switches based on the determination. These illustrative operations relate to manufacturing or building a PV panel system.

Installation of such a PV panel system may be performed at 906 at a later time. During installation, the first switch and the second end of the circuit path of the PV panel are connected to a power system.

The example method 900, like the example method 800, is intended for illustrative purposes, and other embodiments may include variations.

In one such variation, a PV panel is provided at 902, and providing switches and a controller at 904 includes: providing a DC converter comprising a first switch (e.g., 570 in FIGS. 5A to 5D and 7B) to switchably connect a first end of the circuit path of the PV panel to a power system and a second switch (e.g., 580 in FIGS. 5A to 5D and 7B) to switchably connect (i) a point between the first switch and the power system and (ii) a point between a second end of the circuit path of the PV panel and the power system; and providing a controller to determine whether the circuit path of the PV panel is to be bypassed and to control the first and second switches for DC conversion of PV panel output on a determination that the circuit path of the PV panel is not to be bypassed. The controller could also control the first switch to disconnect the first end of the circuit path of the PV panel from the power system and the second switch to close a bypass circuit path that bypasses the circuit path of the PV panel on a determination that the circuit path of the PV panel is to be bypassed. As noted above, installation of such a PV panel system may be performed at 906 at a later time, by connecting the first switch and the second end of the circuit path of the PV panel to a power system.

CONCLUSION

What has been described is merely illustrative of the application of principles of embodiments of the present disclosure. Other arrangements and methods can be implemented by those skilled in the art.

For example, although described primarily in the context of methods and systems, other implementations are also contemplated. At least control features, for instance, could be implemented as instructions stored on a non-transitory computer-readable medium.

It should also be appreciated that DC-POB implementations are not limited to buck converter-based designs as shown in FIGS. 7B and 5A to 5D. The example DC-POB disclosed herein is illustrative of embodiments in which DC to DC converter functions can be integrated with bypass switching without requiring any additional switching components. The switches 570, 580 are dual-purpose switches in the embodiments shown in FIGS. 7B and 5A to 5D, and are switched for DC to DC conversion and panel bypass switching.

We claim:

1. A PhotoVoltaic (PV) panel switching arrangement comprising:
   a DC converter to be coupled between a power system and a circuit path of the PV panel in which a plurality of PV cells of the PV panel are connected, the DC converter comprising:
   a first switch to be coupled between the power system and a first end of the circuit path of the PV panel; and
   a second switch to be coupled between (i) a point between the first switch and the power system and (ii) a point between a second end of the circuit path of the PV panel and the power system,
   a controller operatively coupled to the first switch and to the second switch, to determine whether the circuit path of the PV panel is to be bypassed, to open and close the first and second switches for DC conversion of PV panel output by the DC converter on a determination that the circuit path of the PV panel is not to be bypassed, and to open the first switch to disconnect the first end of the circuit path of the PV panel from the power system and to close the second switch to close a bypass circuit path that bypasses the circuit path of the PV panel to stop DC conversion of the PV panel output by the DC converter on a determination that the circuit path of the PV panel is to be bypassed; and
   a voltage sensor, to be coupled to measure a voltage difference across PV cells in the circuit path of the PV panel,
   the controller being coupled to the voltage sensor to determine whether the circuit path of the PV panel is to be bypassed based on the voltage difference measured by the voltage sensor.

2. The PV panel switching arrangement of claim 1, the controller being configured to determine whether the circuit path of the PV panel is to be bypassed based on whether the voltage difference measured by the voltage sensor is below a threshold value.

3. The PV panel switching arrangement of claim 1, further comprising:
   respective PV cell sub-string switches to be coupled across respective sub-strings of the plurality of PV cells,
   a sub-string voltage sensor to be switchably coupled between respective pairs of voltage measuring points in the circuit path of the PV panel between which the respective sub-strings are connected, to measure respective voltage differences between the respective voltage measuring points,
   the controller being configured to determine whether a PV cell sub-string in the circuit path of the PV panel is to be bypassed based on the voltage differences measured by the sub-string voltage sensor,
   the controller being further operatively coupled to the PV cell sub-string switches, to control the PV cell sub-string switches based on the determination of whether each PV cell sub-string in the circuit path of the PV panel is to be bypassed.

4. The PV panel switching arrangement of claim 1, further comprising:
   a power connection between the controller and the PV panel, to provide power to the controller from the PV panel, the power connection comprising a voltage stabilization circuit.

5. The PV panel switching arrangement of claim 4, the voltage stabilization circuit comprising:
   a diode, an anode of the diode being coupled to the PV panel and a cathode of the diode being coupled to a power input of the controller;
   a capacitance to couple the cathode of the diode to the second end of the circuit path of the PV panel.

6. The PV panel switching arrangement of claim 1, the controller being configured to further determine, subsequent to determining that the circuit path of the PV panel is to be bypassed, whether the PV panel is to be reconnected to the power system, and to control the first and second switches for DC conversion on a further determination that the PV panel is to be reconnected to the power system.

7. The PV panel switching arrangement of claim 1, further comprising:
   the controller being configured to open the first switch and close the second switch responsive to determining that the circuit path of the PV panel is to be bypassed, the controller being further configured to subsequently close the first switch and open the second switch and to further determine whether the PV panel is to be reconnected to the power system based on the voltage difference measured by the voltage sensor while the first switch is closed and the second switch is open being above a threshold value,
   the controller being further configured to control the first and second switches for DC conversion on a further determination that the PV panel is to be reconnected to the power system.

8. The PV panel switching arrangement of claim 1, further comprising:
   the controller being further configured to subsequently determine whether the PV panel is to be reconnected to the power system based on a voltage difference across the second switch while the second switch is closed, and to control the first and second switches for DC conversion on a determination that the PV panel is to be reconnected to the power system.

9. The PV panel switching arrangement of claim 3, further comprising:
   the controller being configured to, responsive to determining that a PV cell sub-string in the circuit path of the PV panel is to be bypassed, close the PV cell sub-string switch that is coupled across the PV cell sub-string, the controller being further configured to determine, subsequent to determining that the PV cell sub-string is to be bypassed, whether the PV cell sub-string is to be reconnected based on a voltage difference across the PV cell sub-string switch while the PV cell sub-string switch is closed, and to control the PV cell sub-string switch of the PV cell sub-string based on the determination of whether the PV cell sub-string is to be reconnected.

10. The PV panel switching arrangement of claim 3, further comprising:
the controller being configured to, responsive to determining that a PV cell sub-string in the circuit path of the PV panel is to be bypassed, close the PV cell sub-string switch that is coupled across the PV cell sub-string,
the controller being further configured to subsequently open the PV cell sub-string switch and to further determine whether the PV cell sub-string is to be reconnected based on the voltage difference measured across the PV cell sub-string by the sub-string voltage sensor while PV cell sub-string switch is open, and to control the PV cell sub-string switch of the PV cell sub-string based on the determination of whether the PV cell sub-string is to be reconnected.

11. The PV panel switching arrangement of claim 1, the DC converter comprising a buck converter.

12. The PV panel switching arrangement of claim 1, the controller being configured to control the first and second switches for DC conversion to maintain the PV panel at its maximum power point.

13. The PV panel switching arrangement of claim 12, the controller being configured to maintain the PV panel at its maximum power point by controlling a duty cycle of switching the first switch for DC conversion.

14. The PV panel switching arrangement of claim 1, the DC converter further comprising:
an inductance coupled between the first switch and a first terminal through which the DC converter is to be coupled to the power system;
a capacitance coupled between the first terminal and a second terminal through which the DC converter is to be coupled to the power system.

15. A method comprising:
determining whether a circuit path of a PhotoVoltaic (PV) panel, in which a plurality of PV cells of the PV panel are connected, is to be bypassed;
opening and closing first and second switches of a DC converter for DC conversion of PV panel output by the DC converter on determining that the circuit path of the PV panel is not to be bypassed, the first switch being coupled between a power system and a first end of the circuit path of the PV panel, the second switch being coupled between (i) a point between the first switch and the power system and (ii) a point between a second end of the circuit path of the PV panel and the power system;
opening the first switch to disconnect the first end of the circuit path of the PV panel from the power system on determining that the circuit path of the PV panel is to be bypassed;
closing the second switch to close a bypass circuit path that bypasses the circuit path of the PV panel to stop DC conversion of the PV panel output by the DC converter on determining that the circuit path of the PV panel is to be bypassed; and measuring a voltage difference across PV cells in the circuit path of the PV panel,
the determining comprising determining whether the circuit path of the PV panel is to be bypassed based on the measured voltage difference.

16. The method of claim 15, the determining comprising determining whether the circuit path of the PV panel is to be bypassed based on whether the measured voltage difference is below a threshold value.

17. The method of claim 15, further comprising:
measuring respective voltage differences across respective sub-strings of the plurality of PV cells in the circuit path of the PV panel,
the determining comprising determining whether the circuit path of the PV panel is to be bypassed based on the measured voltage differences.

18. The method claim 17, further comprising:
determining whether each respective PV cell sub-string in the circuit path of the PV panel is to be bypassed;
controlling respective PV cell sub-string switches coupled across the respective PV cell sub-strings, based on the determination of whether each PV cell sub-string in the circuit path of the PV panel is to be bypassed.

19. The method of claim 15, further comprising:
providing power to a controller from the PV panel;
stabilizing a voltage that is provided to power the controller.

20. The method of claim 19, the stabilizing comprising:
providing a stabilization circuit comprising: a diode, an anode of the diode being coupled to the PV panel and a cathode of the diode being coupled to a power input of the controller; and a capacitor to couple the cathode of the diode to the second end of the circuit path of the PV panel;
opening the first switch and closing the second switch when the capacitor discharges to a first voltage;
closing the first switch and opening the second switch when the capacitor charges to a second voltage above the first voltage.

21. The method of claim 15, further comprising:
determining, subsequent to determining that the circuit path of the PV panel is to be bypassed, whether the PV panel is to be reconnected to the power system;
further controlling the first and second switches for DC conversion on determining that the PV panel is to be reconnected to the power system.

22. The method of claim 16, further comprising:
subsequently closing the first switch and opening the second switch;
determining whether the PV panel is to be reconnected to the power system based on the voltage difference measured while the first switch is closed and the second switch is open being above a threshold value;
controlling the first and second switches for DC conversion on determining that the PV panel is to be reconnected to the power system.

23. The method of claim 16, further comprising:
subsequently determining whether the PV panel is to be reconnected to the power system based on a voltage difference across the second switch while the second switch is closed;
controlling the first and second switches for DC conversion on determining that the PV panel is to be reconnected to the power system.

24. The method of claim 15, further comprising:
measuring respective voltage differences across respective sub-strings of the plurality of PV cells in the circuit path of the PV panel;
determining based on the measured voltage differences whether each respective PV cell sub-string in the circuit path of the PV panel is to be bypassed;
controlling respective PV cell sub-string switches coupled across the respective PV cell sub-strings, based on the determination of whether each PV cell sub-string in the circuit path of the PV panel is to be bypassed,
the controlling of the respective PV cell sub-string switches comprising, responsive to determining that a PV cell sub-string in the circuit path of the PV panel is to be bypassed, closing the PV cell sub-string switch that is coupled across the PV cell sub-string, the method further comprising:
subsequently determining whether the PV cell sub-string is to be reconnected based on a voltage difference across the PV cell sub-string switch while the PV cell sub-string switch is closed;
controlling the PV cell sub-string switch of the PV cell sub-string based on the determination of whether the PV cell sub-string is to be reconnected.

25. The method of claim 15, further comprising:
measuring respective voltage differences across respective sub-strings of the plurality of PV cells in the circuit path of the PV panel,
determining based on the measured voltage differences whether each respective PV cell sub-string in the circuit path of the PV panel is to be bypassed;
controlling respective PV cell sub-string switches coupled across the respective PV cell sub-strings, based on the determination of whether each PV cell sub-string in the circuit path of the PV panel is to be bypassed,
the controlling of the respective PV cell sub-string switches comprising, responsive to determining that a PV cell sub-string in the circuit path of the PV panel is to be bypassed, closing the PV cell sub-string switch that is coupled across the PV cell sub-string, the method further comprising:
subsequently opening the PV cell sub-string switch;
determining whether the PV cell sub-string is to be reconnected to the power system based on the voltage difference measured across the PV cell sub-string while the PV cell sub-string switch is open;
controlling the PV cell sub-string switch based on the determination of whether the PV cell sub-string is to be reconnected.

26. The PV panel switching arrangement of claim 2, wherein the threshold value is below an operating voltage of the controller.

* * * * *

UNITED STATES PATENT AND TRADEMARK OFFICE
CERTIFICATE OF CORRECTION

PATENT NO. : 9,780,234 B2
APPLICATION NO. : 14/286076
DATED : October 3, 2017
INVENTOR(S) : Raymond Kenneth Orr et al.

It is certified that error appears in the above-identified patent and that said Letters Patent is hereby corrected as shown below:

In the Claims

Column 24, Lines 38-40 of Claim 7 delete the text "the controller being configured to open the first switch and close the second switch responsive to determining that the circuit path of the PV panel is to be bypassed,"

Signed and Sealed this
Ninth Day of October, 2018

Andrei Iancu
*Director of the United States Patent and Trademark Office*